United States Patent
Maenishi

(10) Patent No.: US 8,156,642 B2
(45) Date of Patent: Apr. 17, 2012

(54) COMPONENT MOUNTING METHOD

(75) Inventor: Yasuhiro Maenishi, Saga (JP)

(73) Assignee: Panasonic Corporation, Osaka (JP)

( * ) Notice: Subject to any disclaimer, the term of this patent is extended or adjusted under 35 U.S.C. 154(b) by 183 days.

(21) Appl. No.: 12/531,139

(22) PCT Filed: Mar. 19, 2008

(86) PCT No.: PCT/JP2008/000662
§ 371 (c)(1),
(2), (4) Date: Sep. 14, 2009

(87) PCT Pub. No.: WO2008/120461
PCT Pub. Date: Oct. 9, 2008

(65) Prior Publication Data
US 2010/0050429 A1    Mar. 4, 2010

(30) Foreign Application Priority Data

Apr. 3, 2007  (JP) .................................. 2007-097773
Apr. 3, 2007  (JP) .................................. 2007-097839

(51) Int. Cl.
*H05K 3/30* (2006.01)
*H05K 3/36* (2006.01)

(52) U.S. Cl. ................. 29/834; 29/830; 29/832

(58) Field of Classification Search ............. 29/832, 29/830, 831, 833, 834, 840; 438/612
See application file for complete search history.

(56) References Cited

U.S. PATENT DOCUMENTS

| 5,003,692 A * | 4/1991 | Izumi et al. ................. 29/834 |
| 5,501,005 A * | 3/1996 | Onitsuka ..................... 29/833 |
| 5,784,778 A * | 7/1998 | Yoshida et al. .............. 29/834 |
| 5,864,944 A * | 2/1999 | Kashiwagi et al. ........... 29/833 |
| 5,937,513 A * | 8/1999 | Inutsuka et al. .............. 29/832 |
| 6,012,222 A * | 1/2000 | Asai et al. ................... 29/832 |
| 6,158,117 A * | 12/2000 | Mimura et al. .............. 29/833 |
| 6,263,559 B1 * | 7/2001 | Mimura et al. .............. 29/721 |

(Continued)

FOREIGN PATENT DOCUMENTS

JP    64-027822    1/1989

(Continued)

OTHER PUBLICATIONS

English translation of paragraphs [0005], [0006], [0008], [0011], and [0015] to [0017] of JP 2004-103828, Apr. 2004.

(Continued)

*Primary Examiner* — David Angwin
(74) *Attorney, Agent, or Firm* — Wenderoth, Lind & Ponack, L.L.P.

(57) ABSTRACT

A component mounting method in which a component can be mounted with high mounting accuracy even onto a board that is long in a transportation direction in a component mounter, includes: calculating a first amount of correction for a component mounting position by recognizing positions of board marks in the first mounting area; mounting the component at the component mounting position which is being corrected based on the amount of correction calculated in the calculating a first amount of correction; calculating a second amount of correction for a component mounting position by recognizing positions of board marks in the second mounting area; and mounting the component at the component mounting position which is being corrected based on the amount of correction calculated in the calculating a second amount of correction.

3 Claims, 26 Drawing Sheets

U.S. PATENT DOCUMENTS

| | | | |
|---|---|---|---|
| 6,289,582 B1* | 9/2001 | Maenishi et al. | 29/832 |
| 6,293,006 B1* | 9/2001 | Takeda et al. | 29/832 |
| 6,314,640 B1* | 11/2001 | Yoshida et al. | 29/834 |
| 6,327,776 B1* | 12/2001 | Suhara | 29/832 |
| 6,429,387 B1* | 8/2002 | Kuribayashi et al. | 174/261 |
| 6,446,331 B1* | 9/2002 | Horigome | 29/832 |
| 6,453,548 B1* | 9/2002 | Hidese | 29/832 |
| 6,507,997 B2* | 1/2003 | Kawai et al. | 29/833 |
| 6,640,431 B1* | 11/2003 | Yoriki et al. | 29/834 |
| 6,643,921 B2* | 11/2003 | Asai et al. | 29/833 |
| 6,767,763 B1* | 7/2004 | Uchiyama | 438/116 |
| 6,779,259 B2* | 8/2004 | Mimura et al. | 29/833 |
| 6,842,974 B1* | 1/2005 | Maenishi et al. | 29/832 |
| 6,865,803 B2* | 3/2005 | Hidese | 29/832 |
| 6,920,687 B2* | 7/2005 | Nakano et al. | 29/832 |
| 6,938,335 B2* | 9/2005 | Kuribayashi et al. | 29/834 |
| 6,948,232 B1* | 9/2005 | Yazawa et al. | 29/740 |
| 6,971,161 B1* | 12/2005 | Maenishi et al. | 29/832 |
| 7,017,261 B2* | 3/2006 | Okamoto et al. | 29/832 |
| 7,017,263 B2* | 3/2006 | Yanagida | 29/833 |
| 7,025,244 B2* | 4/2006 | Haji | 228/9 |
| 7,065,866 B2* | 6/2006 | Yoshida et al. | 29/834 |
| 7,069,648 B2* | 7/2006 | Hata et al. | 29/832 |
| 7,076,094 B2* | 7/2006 | Chi et al. | 382/146 |
| 7,114,245 B2* | 10/2006 | Ogimoto | 29/739 |
| 7,185,424 B2* | 3/2007 | Mitsumoto et al. | 29/833 |
| 7,200,925 B2* | 4/2007 | Hata et al. | 29/832 |
| 7,243,420 B2* | 7/2007 | Haji et al. | 29/832 |
| 7,275,314 B2* | 10/2007 | Yakiyama et al. | 29/832 |
| 7,281,322 B2* | 10/2007 | Onobori et al. | 29/832 |
| 7,290,331 B2* | 11/2007 | Onobori et al. | 29/832 |
| 7,353,594 B2* | 4/2008 | Yoshida et al. | 29/833 |
| 7,353,596 B2* | 4/2008 | Shida et al. | 29/844 |
| 7,356,918 B2* | 4/2008 | Okuda et al. | 29/833 |
| 7,356,919 B2* | 4/2008 | Hata et al. | 29/833 |
| 7,367,117 B2* | 5/2008 | Yoshii et al. | 29/833 |
| 7,437,818 B2* | 10/2008 | Kabeshita et al. | 29/832 |
| 7,447,045 B2* | 11/2008 | Ikeya et al. | 361/807 |
| 7,533,459 B2* | 5/2009 | Kano et al. | 29/832 |
| 7,581,313 B2* | 9/2009 | Hachiya et al. | 29/833 |
| 7,712,652 B2* | 5/2010 | Morita et al. | 228/180.22 |
| 7,721,424 B2* | 5/2010 | Aoki et al. | 29/834 |
| 7,748,112 B2* | 7/2010 | Hirata et al. | 29/833 |
| 7,748,113 B2* | 7/2010 | Nakamura | 29/840 |
| 7,752,749 B2* | 7/2010 | Shiraishi et al. | 29/840 |
| 7,797,822 B2* | 9/2010 | Sakai et al. | 29/832 |
| 7,867,563 B2* | 1/2011 | Arase et al. | 427/266 |
| 2003/0106207 A1 | 6/2003 | Terui | |
| 2004/0163242 A1* | 8/2004 | Fukunaga | 29/833 |
| 2006/0048383 A1* | 3/2006 | Nishiwaki et al. | 29/833 |

FOREIGN PATENT DOCUMENTS

| | | |
|---|---|---|
| JP | 4-137599 | 5/1992 |
| JP | 2003-069288 | 3/2003 |
| JP | 2003-174294 | 6/2003 |
| JP | 2003-347798 | 12/2003 |
| JP | 2004-103828 | 4/2004 |
| JP | 2006-287150 | 10/2006 |

OTHER PUBLICATIONS

International Search Report issued Apr. 15, 2008 in International (PCT) Application No. PCT/JP2008/000662.
English (machine) translation of JP 2004-103828, Apr. 2004.
English (machine) translation of JP 2003-347798, Dec. 2003.
Partial English translation of Japanese Application No. 64-27822 (Jan. 1989).
Partial English translation of Japanese Application 2006-287150 (Oct. 2006).

* cited by examiner

FIG. 22

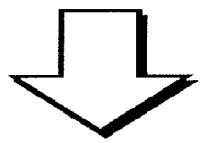

Mounting point pi = (Component type ci, X-coordinate xi, Y-coordinate yi, Mounting angle $\theta i$, Control data $\phi i$)

Mounting point data is list of mounting points pi $$\text{Mounting point data} = \begin{pmatrix} p1 \\ p2 \\ p3 \\ \vdots \\ pN \end{pmatrix} = \begin{pmatrix} c1, x1, y1, \theta 1, \phi 1 \\ c2, x2, y2, \theta 2, \phi 2 \\ c3, x3, y3, \theta 3, \phi 3 \\ \vdots \\ cN, xN, yN, \theta N, \phi N \end{pmatrix}$$

FIG. 23

| Component name | (Component appearance) | Component size (mm) | | | Two-dimensional recognition method | Pickup nozzle | Tact (sec) | Maximum speed level |
|---|---|---|---|---|---|---|---|---|
| | | X | Y | L | | | | |
| 0603CR | | 0.6 | 0.3 | 0.25 | Reflection | SX | 0.086 | 1 |
| 1005CR | | 1.0 | 0.5 | 0.3-0.5 | | SA | | |
| 1608CR | | 1.6 | 0.8 | 0.4-0.8 | | S | 0.094 | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | | Cylindrical chip | 0.11 | |
| 6TR | | 4.3 | 4.5 | 1.5 | | | | |
| 1TIP | | 2.0 | φ1.0 | - | | | | |
| 2TIP | | 3.6 | φ1.4 | - | | | | |
| 1CAP | | 3.8 | 1.9 | 1.6 | | S | | |
| 2CAP | | 4.7 | 2.6 | 2.1 | | | | |
| 3CAP | | 6.0 | 3.2 | 2.5 | | M | | |
| 4CAP | | 7.3 | 4.3 | 2.8 | | | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | 2 |
| 2VOL | | 3.7 | 3.0 | 1.6 | | | | |
| 3VOL | | 4.8 | 4.0 | 3.0 | | | | |

307b

| Unit ID | Head information | Nozzle information | Cassette information | Tray information |
|---|---|---|---|---|
| 130a | 4-nozzle head | SX,SA,⋯ | 96 pieces | 8 stages |
| 130b | 8-nozzle head | None | 96 pieces | None |
| 132a | 8-nozzle head | S,M,⋯ | 48 pieces | None |

COMPONENT MOUNTING METHOD

TECHNICAL FIELD

The present invention relates to a component mounting method for use in a component mounter which mounts a component onto a board, and in particular to a component mounting method for use in a component mounter which mounts a component onto a board that is long in a transportation direction.

BACKGROUND ART

In recent years, circuit boards have been designed to be smaller with higher density and there is a tendency that such circuit boards are produced in a small volume for each of different types thereof. Accordingly, in order to mount components onto a small board and to quickly switch components from one type to another, there has been a higher demand for a component mounter with a large number of component mounting stages that are designed each in a compact manner and coupled together. The use of such a component mounter for performing component mounting allows an increase in the number of components mounted per unit area (improvement of area production efficiency).

In the case of mounting components by using a component mounter with multiple component mounting stages coupled together, a component mountable range covered by one mounting head is limited. Onto a board which is long in a transportation direction, mounting all components at one transportation and positioning time is impossible. Hence, in conventional component mounters, components are mounted on such long a board by moving the board at multiple stages in the transportation direction (see Patent Reference 1, for example). Patent Reference 1: Japanese Unexamined Patent Application Publication No. 2006-287150

SUMMARY OF THE INVENTION

Problems that Invention is to Solve

However, the conventional component mounters are not capable of imaging board marks placed on diagonal corners of a board which is long in the transportation direction, to perform correction on positions of components to be mounted. There accordingly remains a problem that a degree of component-mounting accuracy is low.

The present invention has been conceived in order to solve the above-mentioned problem, and an object of the present invention is to provide a method for component mounting in which components can be mounted with high mounting accuracy even onto a board that is long in the transportation direction in a component mounter.

Means to Solve the Problems

In order to achieve the above object, a component mounting method according to an aspect of the present invention is a component mounting method for use in a component mounter which mounts a component onto a board, the board having a first mounting area and a second mounting area which are different from each other and each correspond to a component mountable range of a mounting head of the component mounter, wherein the first mounting area has a pair of separate board marks each positioned near either end of the first mounting area, and the second mounting area has a pair of separate board marks each positioned near either end of the second mounting area, the method including:

calculating a first amount of correction by (i) recognizing positions of the board marks in the first mounting area, (ii) calculating an amount of displacement of the recognized positions from predetermined positions of the board marks, and (iii) calculating, based on the amount of displacement, the amount of correction for a component mounting position;

mounting the component at the component mounting position in the first mounting area, the component mounting position being corrected based on the amount of correction calculated in the calculating a first amount of correction;

calculating a second amount of correction after the mounting the component in the first mounting area, by (i) recognizing positions of the board marks in the second mounting area, (ii) calculating an amount of displacement of the recognized positions from predetermined positions of the board marks, and (iii) calculating, based on the amount of displacement, the amount of correction for a component mounting position; and mounting the component at the component mounting position in the second mounting area, the component mounting position being corrected based on the amount of correction calculated in the calculating a second amount of correction.

Both the first and second mounting areas have the board marks. The board marks are recognized prior to mounting the components into the first mounting area, and also the board marks are recognized prior to mounting the components into the second mounting area. This allows for correction of positions of both components which are to be mounted in the first mounting area and in the second mounting area so that the components can be mounted with high positional accuracy. Thus, as for a board which is long in the transportation direction, the components can be mounted thereon with high mounting accuracy by setting the first and second mounting areas along the transportation direction.

A component mounting method according to another aspect of the present invention is a component mounting method for use in a component mounter which mounts a component onto a board, the board having a first mounting area and a second mounting area which are different from each other and each correspond to a component mountable range of a mounting head of the component mounter, wherein the first mounting area has a pair of separate board marks each positioned near either end of the first mounting area, and the second mounting area has a pair of separate board marks each positioned near either end of the second mounting area, the mounting condition determining method including:

determining a first mounting condition according to which the component mounter (i) recognizes positions of the board marks in the first mounting area, (ii) calculates an amount of displacement of the recognized positions from predetermined positions of the board marks, and (iii) calculates, based on the amount of displacement, an amount of correction for a component mounting position;

determining a second mounting condition according to which the component mounter mounts the component at the component mounting position in the first mounting area, the component mounting position being corrected based on the amount of correction calculated in the determining a first mounting condition;

determining a third mounting condition according to which, after the mounting the component in the first mounting area, the component mounter (i) recognizes positions of the board marks in the second mounting area, (ii) calculates an amount of displacement of the recognized positions from predetermined positions of the board marks, and (iii) calculates, based on the amount of displacement, an amount of correction for a component mounting position; and determining a fourth mounting condition according to which the component mounter mounts the component at the component mounting position in the second mounting area, the component mounting position being corrected based on the amount of correction calculated in the determining a third mounting condition.

Preferably, the mounting condition determining method further includes composing a turn of only a pickup operation in which every pickup nozzle of the mounting head holds the component, when the component mounter mounts the component in at least one of the first mounting area and the second mounting area, wherein the turn indicates one set of repeating operations of the mounting head, the repeating operations each including pickup, move, and mounting operations.

The turns are configured such that in at least one of the first mounting area and the second mounting area, components are mounted by a line gang pickup head having its all pickup nozzles with the components. This allows for determining the order of mounting components such as to minimize the sum of the number of turns necessary for mounting the components in the first mounting area and the number of turns necessary for mounting the components in the second mounting area.

A method for producing a board according to another aspect of the present invention is a board manufacturing method including:

determining a first mounting area and a second mounting area on a board, which are different from each other and each correspond to a component mountable range of a mounting head of a component mounter;

providing a pair of separate board marks near either end of the first mounting area; and providing a pair of separate board marks near either end of the second mounting area.

Both the first and second mounting areas have the board marks which are used for calculating an amount of correction for a component mounting position in each of the mounting areas. It is therefore possible to obtain the amount of correction for the component mounting position by recognizing the positions of the board marks, when the components are being mounted in each of the mounting areas. Consequently, by setting the first mounting area and the second mounting area along the transportation direction, the components can be mounted with high accuracy on even a board which is long in the transportation direction in the component mounter.

Preferably, in the providing board marks in the first mounting area, two board marks are provided on a diagonal of the first mounting area, and in the providing board marks in the second mounting area, two board marks are provided on a diagonal of the second mounting area.

Positioning the two board marks on the diagonal enables that the two board marks can be positioned away from each other both vertically and horizontally in each of the mounting areas. As a result, it is possible to obtain a precise amount of correction for the component mounting position, so that the component can be mounted with high mounting accuracy.

It is to be noted that the invention may be implemented not only as the component mounting method including such characteristic steps but also as, for example, a mounting condition determining method and a computer program causing a computer to execute the characteristic steps included in the mounting condition determining method.

Moreover, the invention may be implemented not only as a board manufacturing method including such characteristic steps and also as, for example, a board manufactured by such a board manufacturing method and a computer program for determining positions of board marks. In addition, it goes without saying that such program may be distributed via a recording medium such as a Compact Disc-Read Only Memory (CD-ROM) and a communication network such as the Internet.

Effects of the Invention

It is possible to provide a method for component mounting in which components can be mounted with high mounting accuracy even onto a board which is long in a transportation direction in a component mounter.

BRIEF DESCRIPTION OF DRAWINGS

FIG. 22 is a view showing one example of mounting point data.

FIG. 23 is a view showing one example of component library.

NUMERICAL REFERENCES

Figure 1:
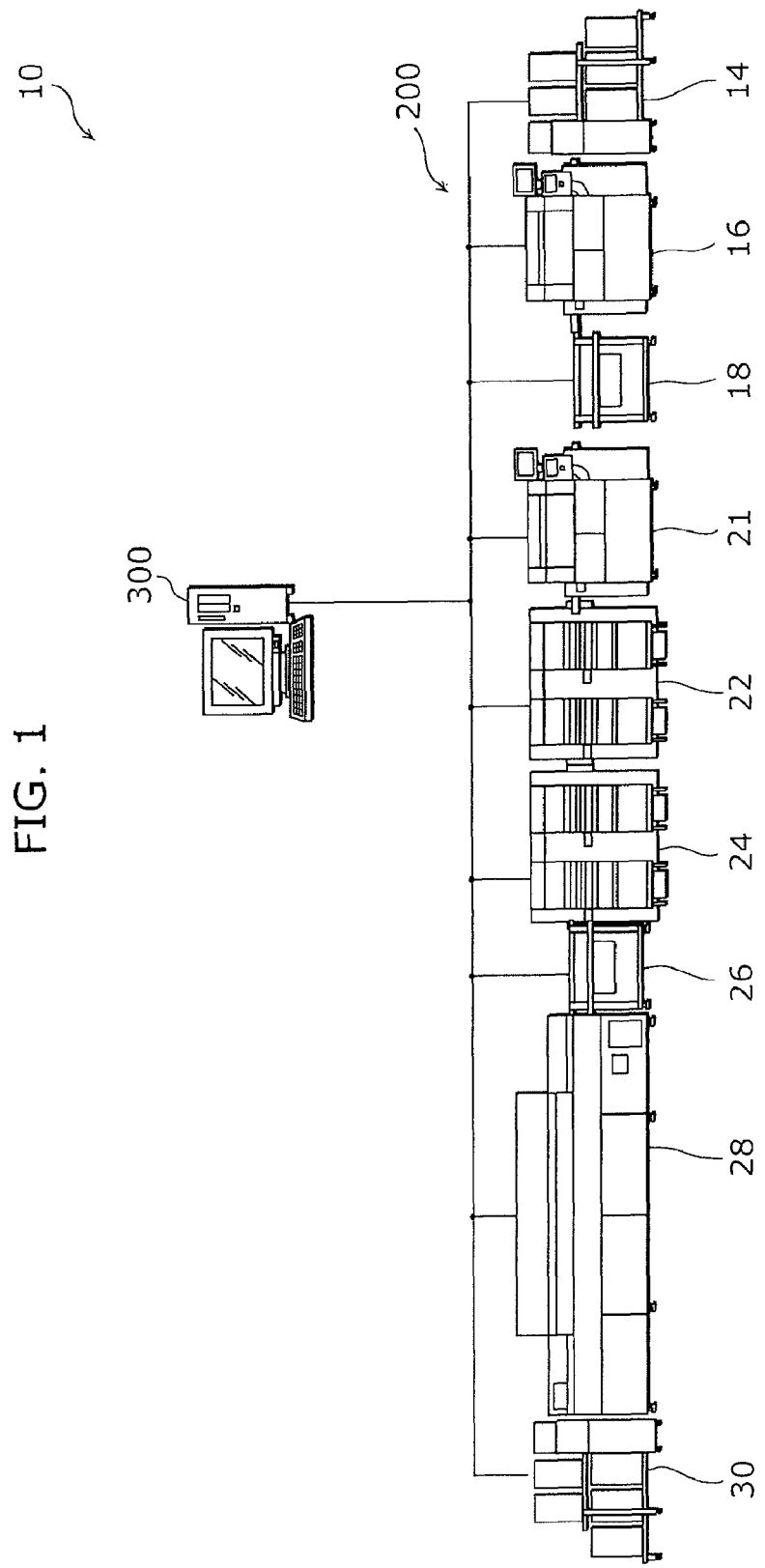
FIG. 1 is an outer view of a board production system according to an embodiment of the present invention.

10 Production system
14, 30 Stocker
16 solder printer
18, 26 Conveyer
20 Board
20a to 20m Board marks
21 Adhesive dispenser
22, 24 Component mounter
25 Area
25a, 25b Individual marks
28 Reflow furnace
120a Front sub-equipment
120b Rear sub-equipment
121 Line gang pickup head
122 Beam
123 Component cassette
124 First stopper
125a, 125b Component supply units
126 Component recognizing camera
127 Second stopper
128 Tray supply unit
129 Rail
129a Fixed rail
129b Movable rail
200 Mounting line
300 Control device
301 Arithmetic control unit
302 Display unit
303 Input unit
304 Memory unit
305 Program storing unit
305a Component mounting condition determining unit
305b Board mark position determining unit
306 Communication I/F unit
307 Database unit
307a Mounting point data
307b Component library
307c Mounting apparatus information
307b Component mountable range information
408, 410 Component mountable range

DETAILED DESCRIPTION OF THE INVENTION

Hereinafter, a production system according to an embodiment of the present invention shall be explained with reference to drawings.

FIG. 1 is an outer view of a board production system according to an embodiment of the present invention. A production system 10 is a system for producing a component mounted board, which is formed by mounting components onto a board, and provided with a mounting line 200 and a control device 300.

The mounting line 200 is a system for transporting a board from an upstream production machine toward a downstream production machine to produce the board with components mounted thereon, and provided with stockers 14, 30, a solder printer 16, conveyors 18, 26, an adhesive dispenser 21, component mounters 22, 24, and a reflow furnace 28.

The stockers 14, 30 are each a device for stocking boards, and the stocker 14 is positioned upstream in the production line while the stocker 30 is positioned downstream in the production line. This means that the stocker 14 stocks boards with no components mounted thereon while the stocker 30 stocks finished boards with components mounted thereon.

The solder printer 16 is a device for printing solder onto a board.

The conveyors 18, 26 are each a device for transporting a board.

The adhesive dispenser 21 is a device for applying adhesive onto only required part for provisionally bonding electronic components onto a board 20 so that relatively large electronic components will not go off the board 20 when being transported. For example, the adhesive dispenser 21 moves a tank and a board toward each other so that viscous adhesive pushed out of the tank is applied in a linear or dotted pattern to the board. It is to be noted that in the adhesive dispenser 21, a marking head for applying red ink in the shape of a later-described board mark is further provided on the board 20.

The component mounters 22, 24 are each a device for mounting components onto a board.

The reflow furnace 28 is a device for heating the board with component mounted thereon to melt solder or the like so that the components will be then fixed onto the board.

The control device 300 is a computer for controlling respective production machines constituting the mounting line 200. A configuration of the control device 300 shall be explained hereinafter.

Figure 2:
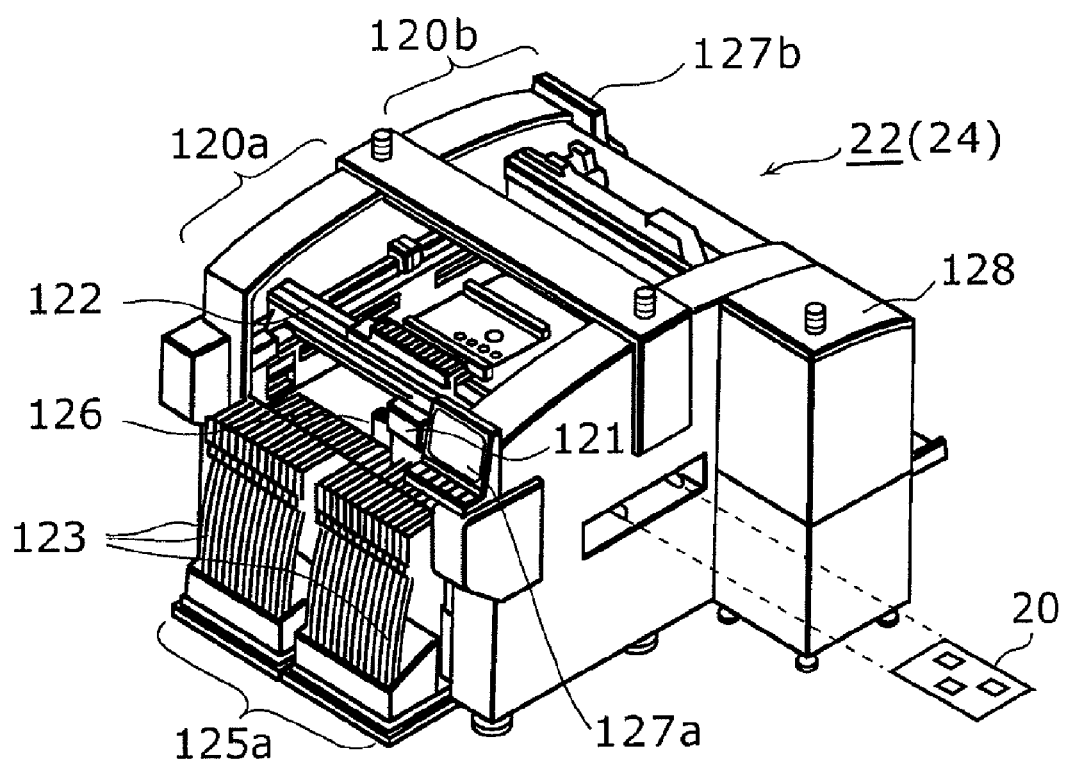
FIG. 2 is an outer view showing a configuration of a component mounter according to an embodiment of the present invention.

FIG. 2 is an outer view showing a configuration of a component mounter according to an embodiment of the present invention.

The component mounter 22 is an apparatus for mounting electronic components while transferring the circuit board from the upstream to the downstream, and includes two sub-equipment (a front sub-equipment 120a and a rear sub-equipment 120b) for performing component mounting in the form of cooperated alternate operation. A configuration of the component mounter 24 is the same as that of the component mounter 22. Thus, the detailed description thereof is not repeated here.

The front sub-equipment 120a includes: a component supply unit 125a which includes an array of component cassettes 123 each storing a component tape; a line gang pickup head 121 having a plurality of pickup nozzles (hereinafter simply referred to as "nozzles" in some cases) capable of picking up electronic components from the component cassettes 123 and mounting them onto the board 20; a beam 122 to which the line gang pickup head 121 is attached; and a component recognizing camera 126 for inspecting in a two-dimensional or three-dimensional manner the pickup state of components picked up by the line gang pickup head 121.

The line gang pickup head 121 is equipped with a camera for recognizing a position of the board mark which is to be described hereinafter.

The rear sub-equipment 120b also has a configuration similar to that of the front sub-equipment 120a. Here, the rear sub-equipment 120b has a tray supply unit 128 which supplies tray components. However, the tray supply unit 128 or the like may not be provided in some cases depending on the sub-equipment.

Here, the "component tape" indicates a tape (carrier tape) on which a plurality of components of the same component type are arranged. This tape is supplied in form that it is wound around a reel (supply reel) or the like, and is mainly used for supplying, to a component mounter, components which are in a relatively small size and are referred to as chip components.

Specifically, the component mounter 120 is a mounting apparatus that has the function of a component mounter referred to as a high-speed mounter and the function of a component mounter referred to as a multifunctional mounter. The high-speed mounter is an apparatus that generally is characterized by high productivity and mounts electric components of 10 mm square or smaller at a speed of the order of 0.1 second each. The multifunctional mounter is an apparatus that mounts large-size electronic components of 10 mm square or larger, irregularly shaped components such as switches and connectors, and Integrated Circuit (IC) components such as a Quad Flat Package (QFP) and a Ball Grid Array (BGA).

In other words, the component mounter 22 is designed to be capable of mounting almost all types of electronic components (the range of components to be mounted extends from a 0.4-mm×0.2-mm chip resistor to a 200-mm connector). Thus, by simply arranging a necessary number of the component mounters 22, a mounting line can be constructed.

Figure 3:
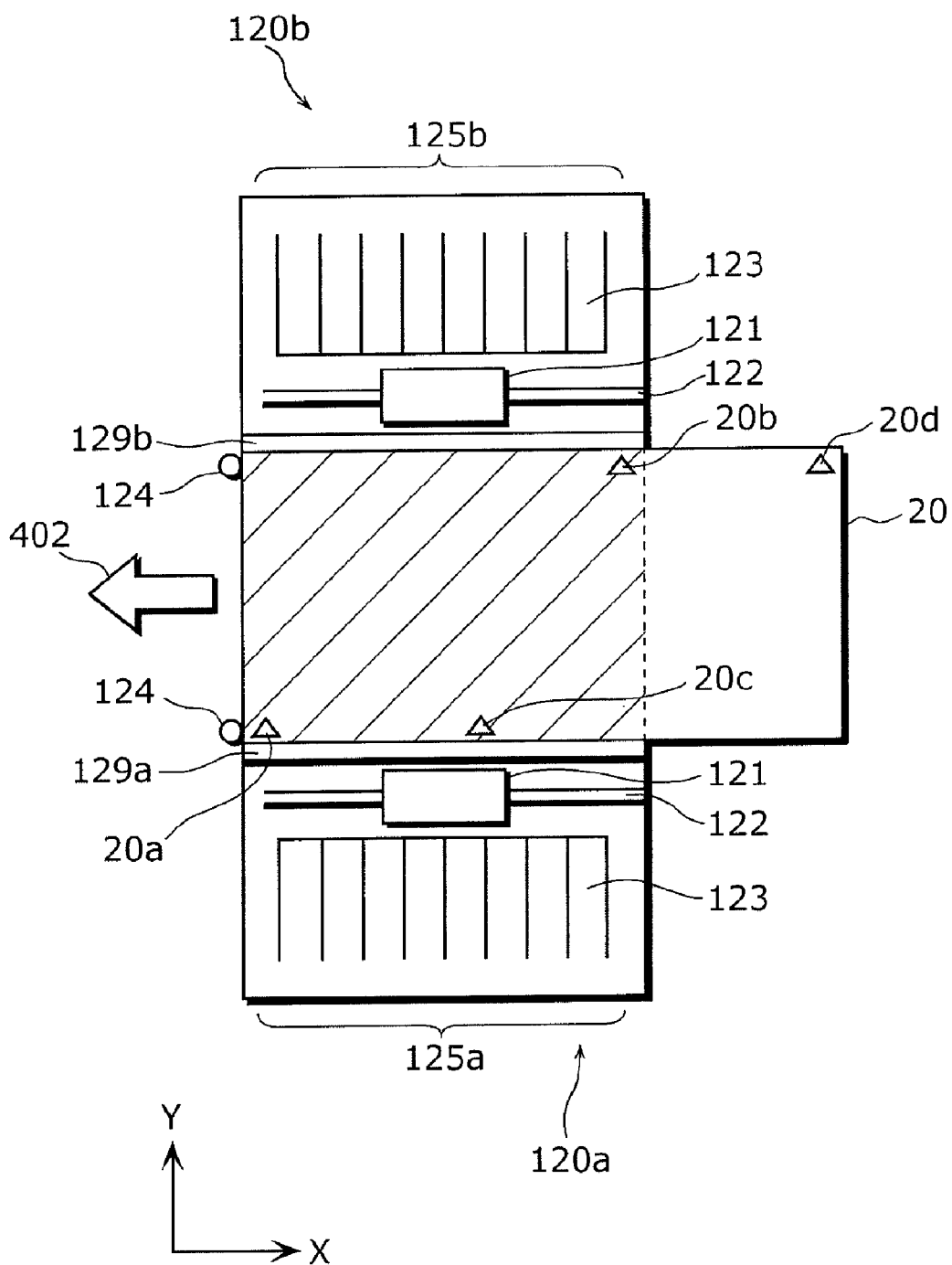
FIG. 3 is a plan view of the component mounter showing a major inner configuration thereof.

FIG. 3 is a plan view of the component mounter 22 showing a major inner configuration thereof.

In the component mounter 22, the respective front sub-equipment 120a and the rear sub-equipment 120b are provided in the forward and backward directions (y-axis direction) of the component mounter 22 which are perpendicular to the transportation direction (x-axis direction) of the board 20.

The front sub-equipment 120a and the rear sub-equipment 120b cooperate with each other so as to perform mounting work on one board 20.

The front sub-equipment 120a and the rear sub-equipment 120b are provided with a component supply unit 125a and a component supply unit 125b, respectively. Further, each of the front sub-equipment 120a and the rear sub-equipment 120b is provided with a beam 122 and a line gang pickup head 121. Furthermore, in the component mounter 120, a pair of rails 129 for transporting the board 20 is provided between the front sub-equipment and the rear sub-equipment.

The rails 129 include a fixed rail 129a and a movable rail is 129b. The position of the fixed rail 129a is fixed in advance, whereas the movable rail 129b can be moved in the y-axis direction in accordance with the length of the transported board 20 in the y-axis direction.

It is to be noted that the component recognizing camera 126, the tray supply unit 128 and the like are omitted in the figure, since they are not essential parts of the present invention.

The beam 122 is a rigid body extending in the x-axis direction (the transportation direction of the board 20), and can move on a railway not shown) provided in the y-axis direction (perpendicular to the transportation direction of the board 20), while being parallel to the x-axis direction. Further, the beam 122 allows the line gang pickup head 121 attached to the beam 122 to move along the beam 122, that is, to move in the x-axis direction. Thus, by virtue of the movement of the beam 122 in the y-axis direction and the x-axis directional movement of the line gang pickup head 121 that moves in the y-axis direction in association with the movement of the beam 122, the line gang pickup head 121 can move freely in the XY plane. Further, a plurality of motors such as motors (not shown) for driving these are provided in the beam 122. Electric power to these motors and the like is supplied via the beam 122.

The component mounter 22 is provided further with a first stopper 124 for fixing the board 20 which is transported in the transportation direction. From right to left in the figure the board 20 is transported in a direction indicated by an arrow 402. The first stopper 124 is provided at such a position that a left part of the board 20 will be included in a movable range of the line gang pickup head 121. Components can therefore be mounted on the left part of the board 20 (a shaded portion of the board 20) by the line gang pickup head 121 when the board 20 transported is fixed at the position of the first stopper 124. In the following explanation, the left part of the board 20 (the shaded portion of the board 20) will be referred to as "first mounting area". The first mounting area corresponds to a component mountable range of the line gang pickup head 121.

Figure 4:
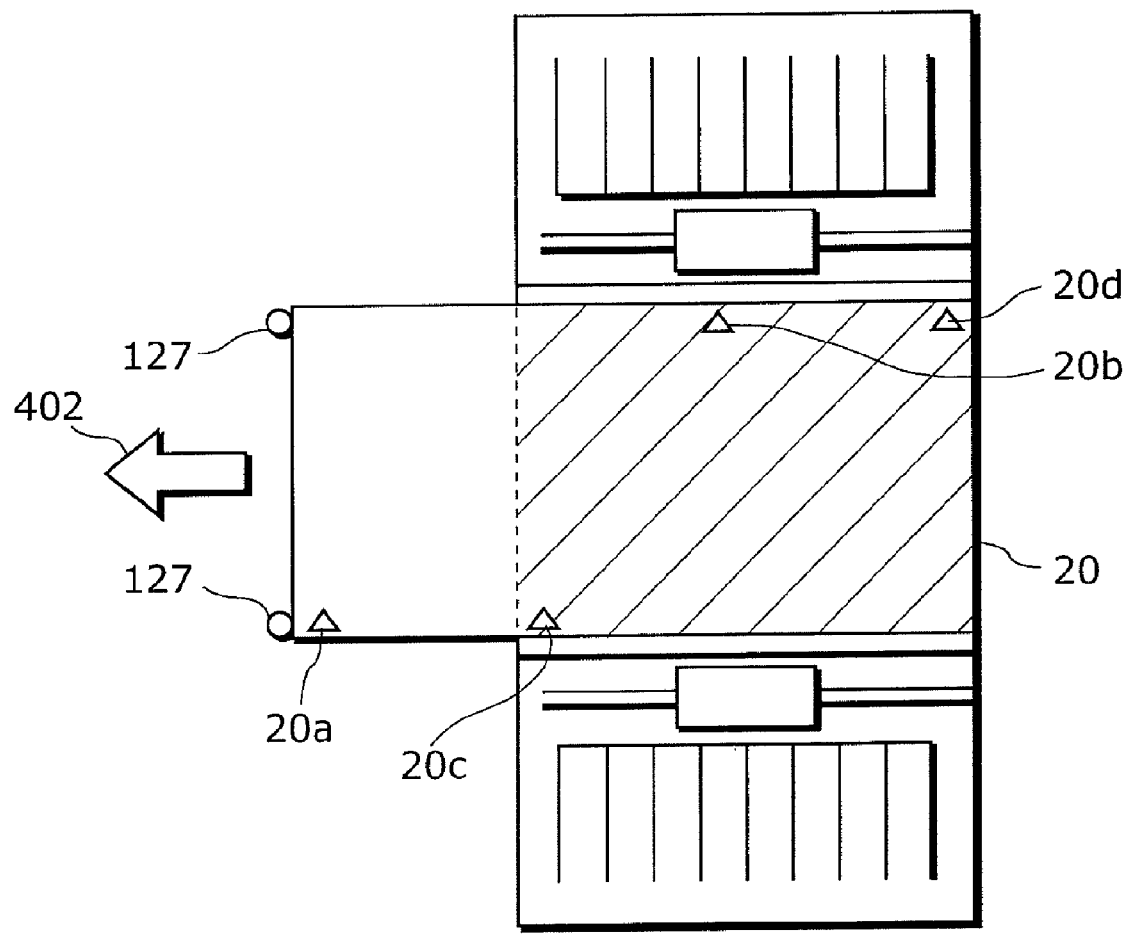
FIG. 4 is another plan view of the component mounter showing a major inner configuration thereof.

FIG. 4 is another plan view of the component mounter 22 showing a major inner configuration thereof.

The component mounter 22 is provided further with a second stopper 127 for fixing the board 20 which is transported in the transportation direction. The board 20 is transported in a direction indicated by an arrow 402 from right to left in the figure. The second stopper 127 is provided at such a position that a right part of the board 20 is included in a movable range of the line gang pickup head 121. Components can therefore be mounted on the right part of the board 20 (a shaded portion of the board 20) by the line gang pickup head 121 when the board 20 transported is fixed at the position of the second stopper 127. In the following explanation, the right part of the board 20 (the shaded portion of the board 20) will be referred to as "second mounting area". The second mounting area corresponds to a component mountable range of the line gang pickup head 121.

By stopping the board 20 at the positions of the first stopper 124 and the second stopper 127 as above, positioning of the board 20 is performed so that the component mountable range of the line gang pickup head is entirely covered by the board 20. This makes it possible to maximize a distance between a pair of board marks within the component mountable range of the line gang pickup head. Consequently, the accuracy for correcting a component mounting position through recognition of board marks can be the highest in the component mounter 22.

Figure 5:
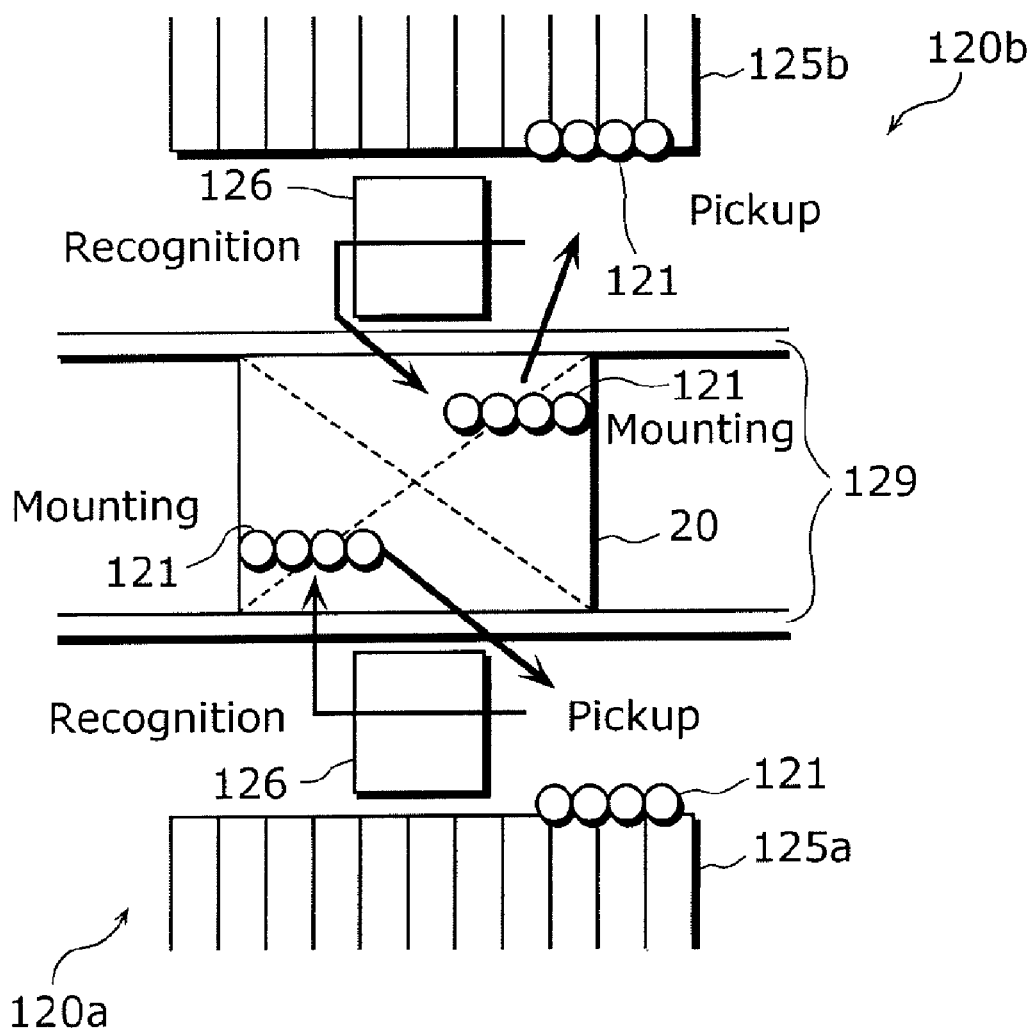
FIG. 5 is a diagram for illustrating component mounting performed by the component mounter.
Figure 6:
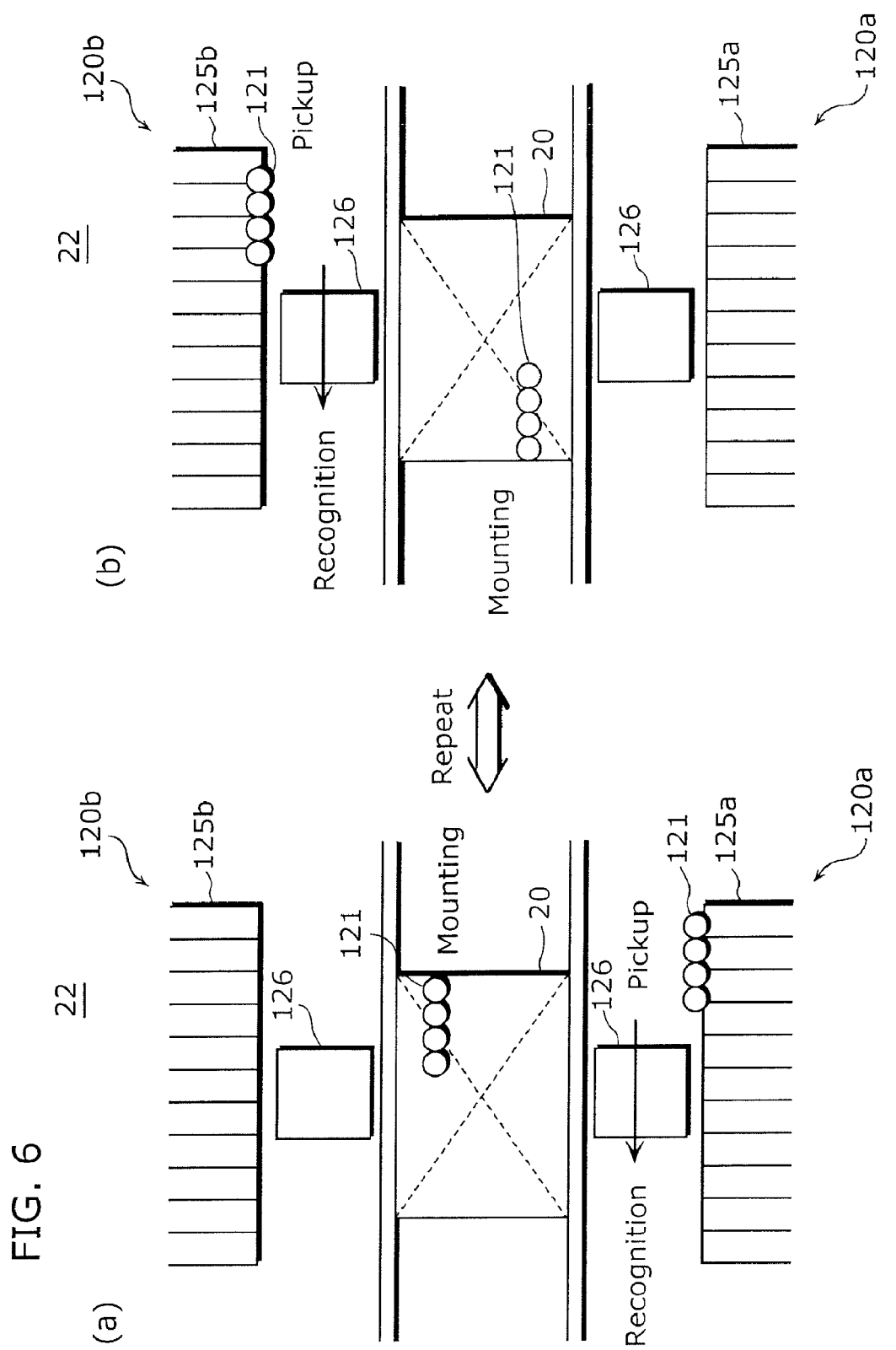
FIG. 6 is a diagram for illustrating component mounting performed by the component mounter.

FIGS. 5 and 6 are diagrams for illustrating component mounting performed by the component mounter 22. The component mounter 24 performs component mounting likewise and thus, description thereof is not repeated.

As shown FIG. 5, the line gang pickup head 121 of the rear sub-equipment 120b mounts the components onto the board 20 by repeating three kinds of operations including "pickup" of the components from the component supply unit 125b, "recognition" of the picked-up components using the component recognizing camera 126, and "mounting" of the recognized components onto the board 20.

It is to be noted that the line gang pickup head 121 of the front sub-equipment 120a similarly mounts the components onto the board 20 by alternately repeating the three kinds of operations, that is, "pickup", "recognition" and "mounting".

When the two line gang pickup heads 121 simultaneously perform "mounting" of the components, the line gang pickup heads 121 mount the components onto the board 20 in the form of coordinated operation in order to avoid collision with each other. More specifically, as shown in FIG. 6(a), while the line gang pickup head 121 of the rear sub-equipment 120b is performing the "mounting" operation, the line gang pickup head 121 of the front sub-equipment 120a performs the "pickup" operation and the "recognition" operation. In contrast, as shown in FIG. 6(b), while the line gang pickup head 121 of the front sub-equipment 120a is performing the "mounting" operation, the line gang pickup head 121 of the rear sub-equipment 120b performs the "pickup" operation and the "recognition" operation. As described, since the two line gang pickup heads 121 alternately perform the "mounting" operation, collision between the line gang pickup heads 121 can be avoided. Here, in an ideal case, if one of the line gang pickup heads 121 completes the "pickup" operation and the "recognition" operation during the time that the other line gang pickup head 121 performs the "mounting" operation, the one of the line gang pickup heads 121 can start the "mounting" operation without delay at the time that other line gang pickup head 121 completes the "mounting" operation. This improves production efficiency.

Hereinbelow, the situation of a board which is long in the transportation direction is explained by referring to concrete examples shown in FIGS. 7 to 18, and such a board which is long in the transportation direction is characterized in that a pair of board marks spaced apart from each other by a predetermined distance are provided in each of the first mounting area and the second mounting area.

Figure 7:
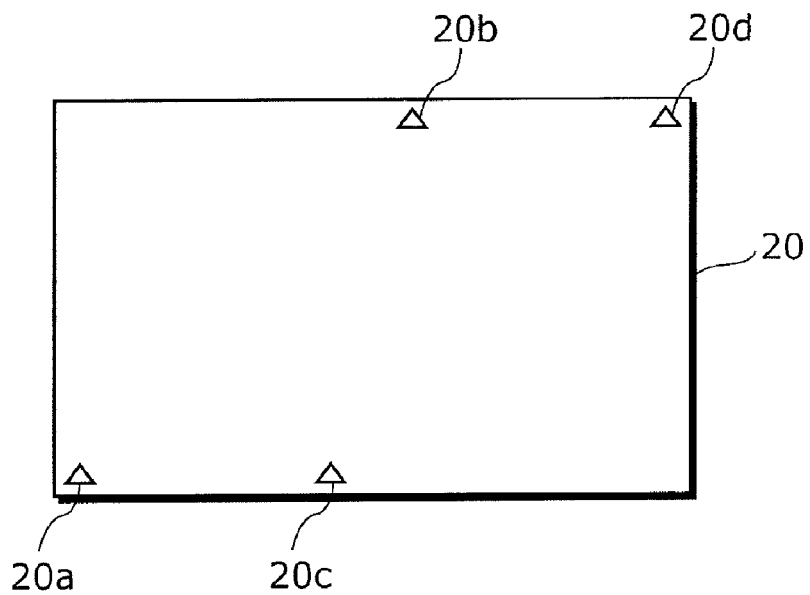
FIG. 7 is a view showing one example of a board which is long in a transportation direction.

FIG. 7 is a view showing one example of a board which is long in the transportation direction.

A board 20 has a pair of board marks 20a, 20b for calculating an amount of correction such as an amount of displacement for the first mounting area (a shaded portion in FIG. 8) of the board 20 when the board 20 is fixed at the position of the first stopper 124. The board marks 20a, 20b are provided on diagonally opposite ends of the first mounting area.

Further, the board 20 has a pair of board marks 20c, 20d for calculating an amount of correction such as an amount of displacement for the second mounting area (a shaded portion in FIG. 9) of the board 20 when the board 20 is fixed at the position of the second stopper 127. The board marks 20c, 20d are provided on diagonally opposite ends (or in the vicinity of diagonally opposite ends) of the second mounting area.

Figure 10:
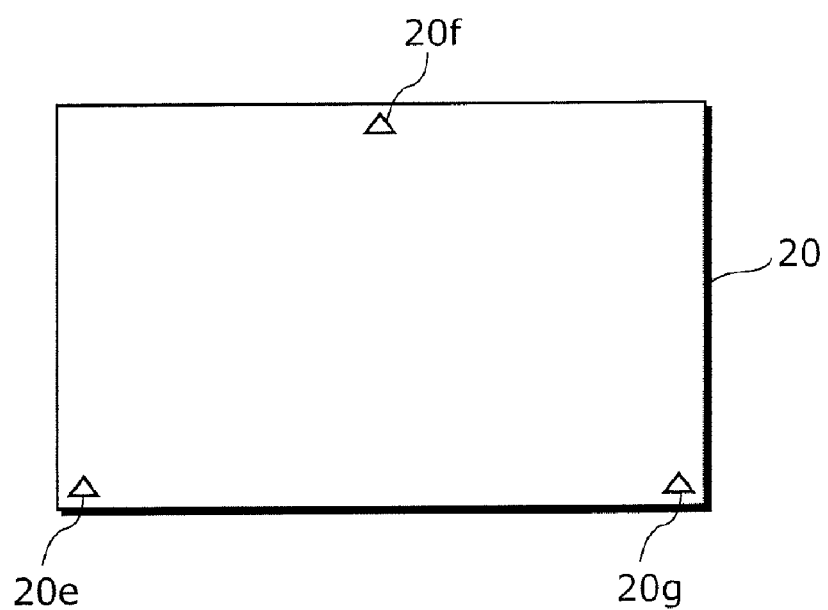
FIG. 10 is a view showing another example of a board which is long in a transportation direction.
Figure 11:
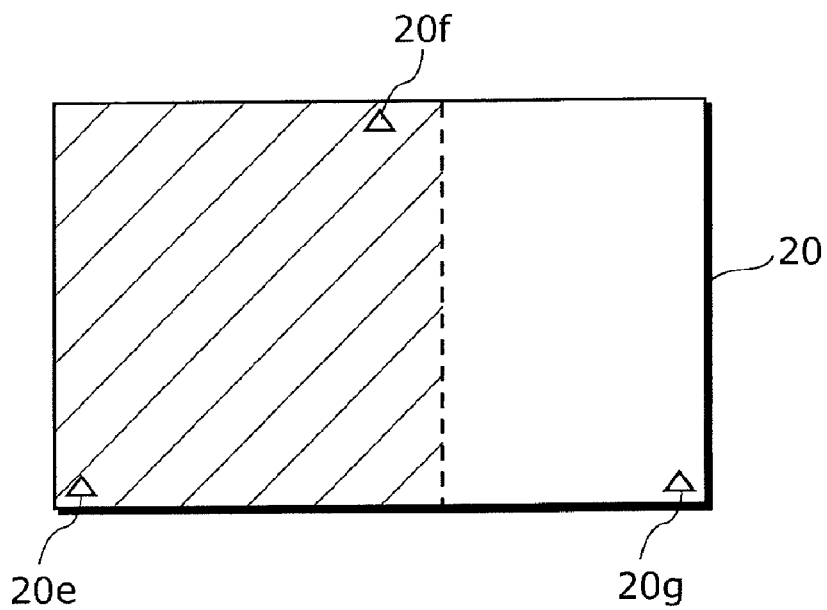
FIG. 11 is a view showing the first mounting area of the board shown in FIG. 10.
Figure 12:
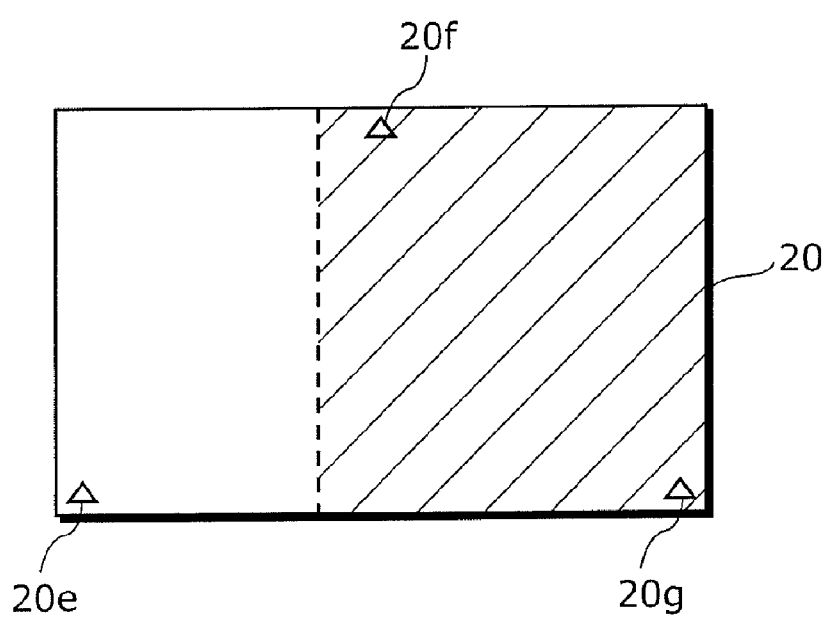
FIG. 12 is a view showing the second mounting area of the board shown in FIG. 10.

FIG. 10 is a view showing one example of a board which is long in the transportation direction.

A board 20 has a pair of board marks 20e, 20f for calculating an amount of correction such as an amount of displacement for the first mounting area (a shaded portion in FIG. 11) of the board 20 when the board 20 is fixed at the position of the first stopper 124.

Further, the board 20 has a pair of board marks 20f, 20g for calculating an amount of correction such as an amount of displacement for the second mounting area (a shaded portion in FIG. 12) of the board 20 when the board 20 is fixed at the position of the second stopper 127. It is to be noted that in this board 20, the board mark 20f is used in both the first mounting area and the second mounting area. As a result, a distance between the board marks is a little shorter but the number of board marks on the board 20 can be smaller than those in the case, shown in FIGS. 7 to 9, of the board marks which are provided on diagonally opposite ends of each of the first mounting area and the second mounting area.

Figure 13:
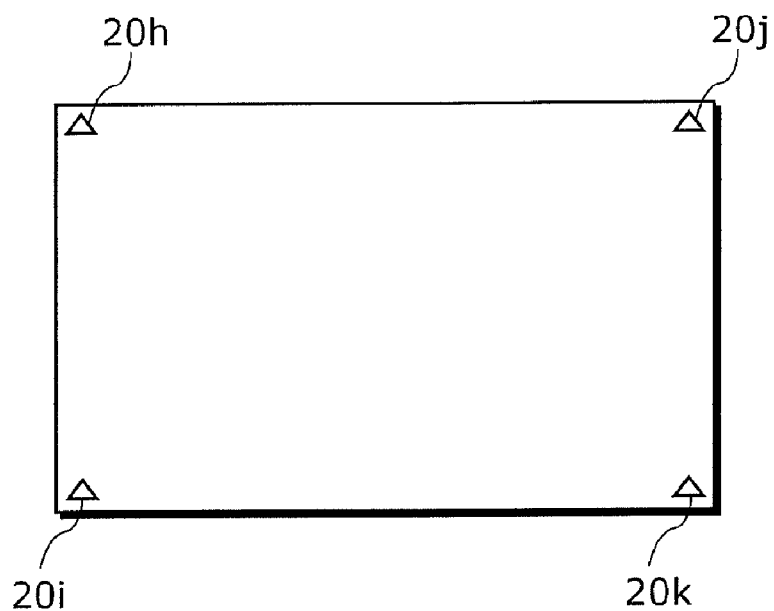
FIG. 13 is a view showing another example of a board which is long in a transportation direction.
Figure 14:
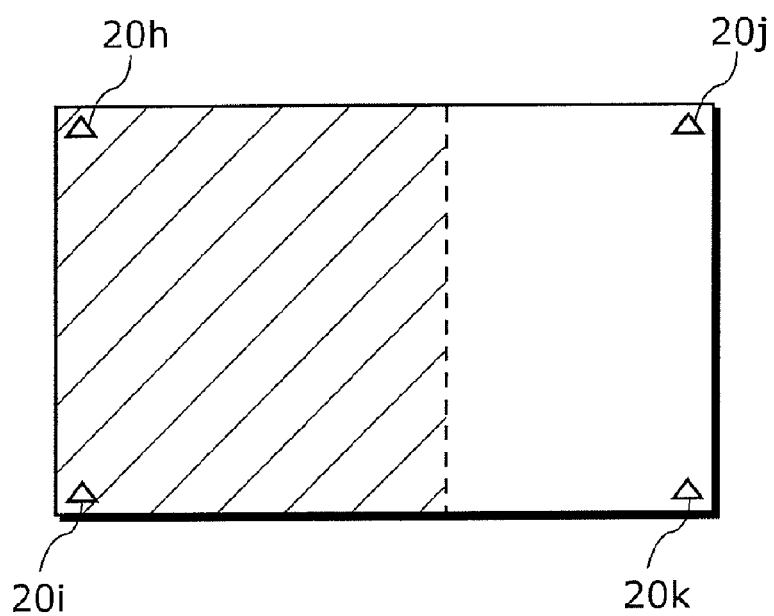
FIG. 14 is a view showing the first mounting area of the board shown in FIG. 13.
Figure 15:
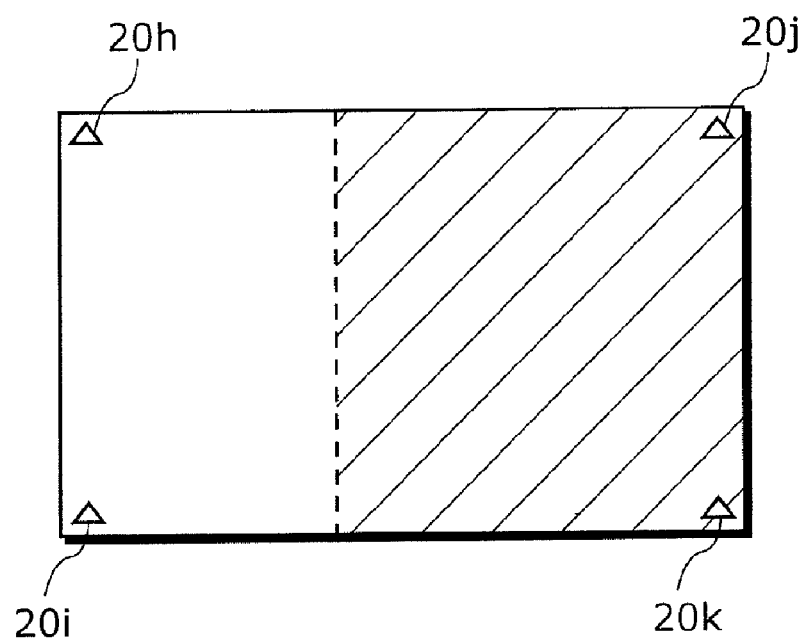
FIG. 15 is a view showing the second mounting area of the board shown in FIG. 13.

FIG. 13 is a view showing one example of a board which is long in the transportation direction.

A board 20 has a pair of board marks 20h, 20i for calculating an amount of correction such as an amount of displacement for the first mounting area (a shaded portion in FIG. 14) of the board 20 when the board 20 is fixed at the position of the first stopper 124.

Further, the board 20 has a pair of board marks 20j, 20k for calculating an amount of correction such as an amount of displacement for the second mounting area (a shaded portion in FIG. 15) of the board 20 when the board 20 is fixed at the position of the second stopper 127. It is to be noted that as shown in this board 20, the pair of board marks 20h, 20i are not provided on a diagonal of the first mounting area. Likewise, the pair of board marks 20j and 20k are not provided on a diagonal of the second mounting area either. It is to be noted that although the pair of board marks on the diagonal are preferably used to calculate an amount of correction such as an amount of displacement, the amount of correction can be calculated by using a pair of board marks which are not provided on a diagonal.

Figure 16:
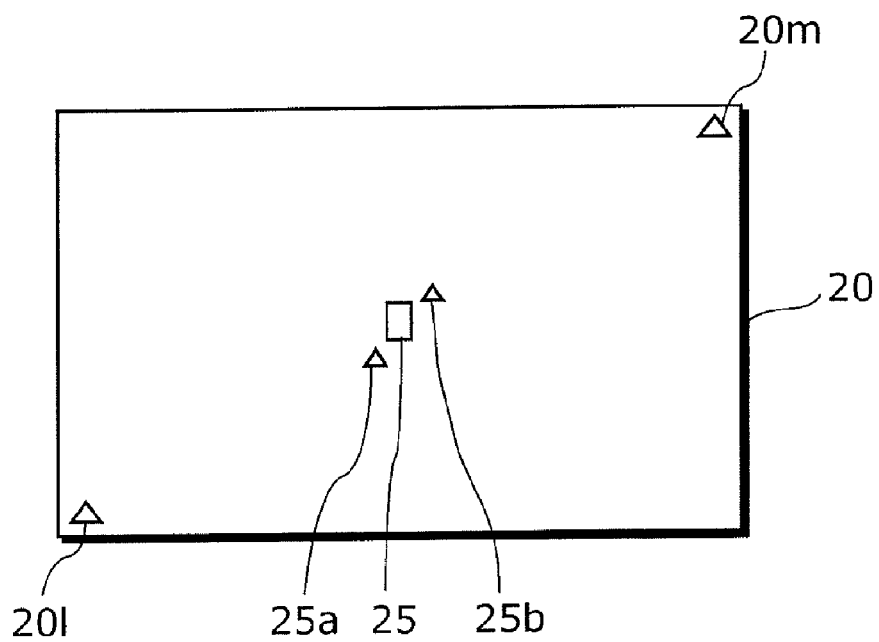
FIG. 16 is a view showing another example of a board which is long in a transportation direction.
Figure 17:
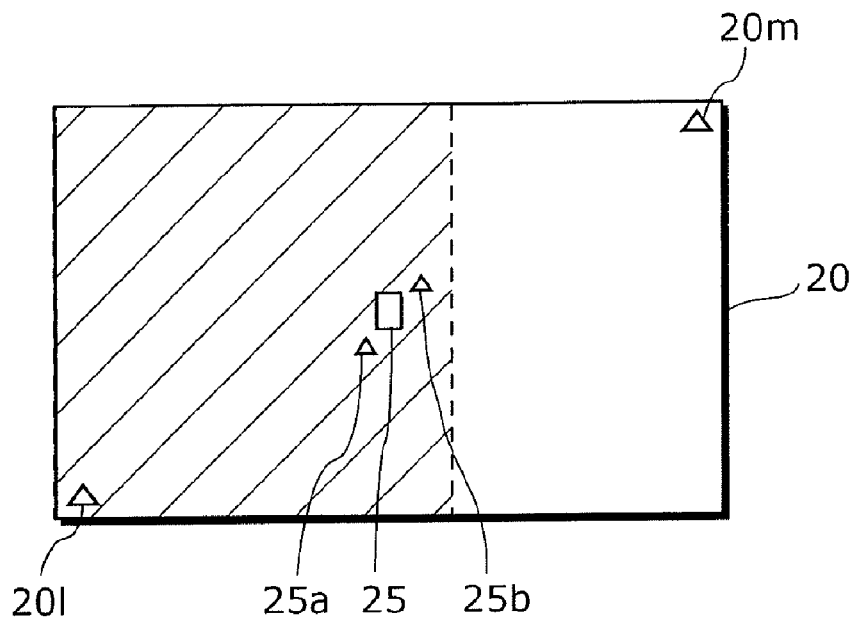
FIG. 17 is a view showing the first mounting area of the board shown in FIG. 16.
Figure 18:
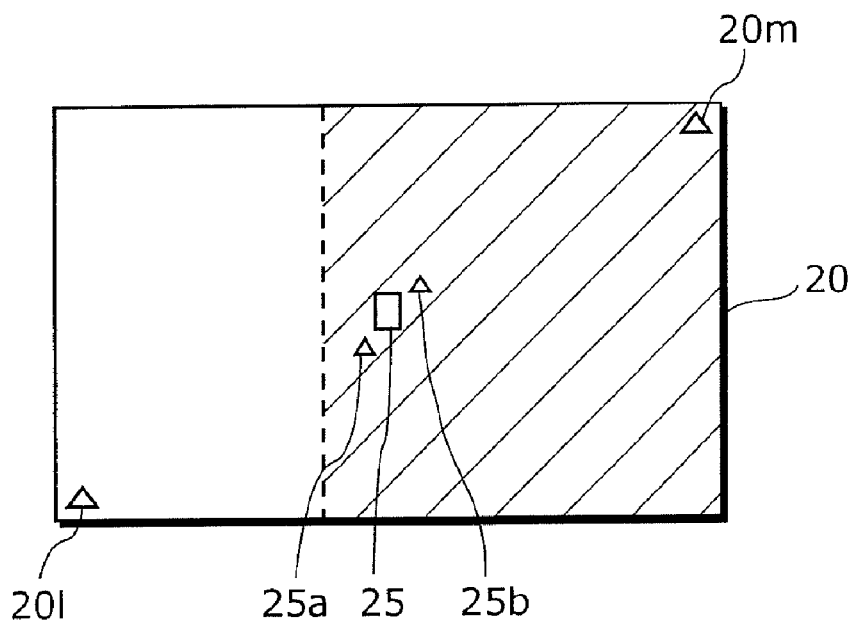
FIG. 18 is a view showing the second mounting area of the board shown in FIG. 16.

FIG. 16 is a view showing one example of a board which is long in the transportation direction.

A board 20 includes an area 25 where components are to be mounted. The board 20 further includes individual marks 25a, 25b for recognizing a position of the area 25 when the components are being mounted in the area 25. Furthermore, board marks 20l, 20m are provided on a bottom left corner and a top right corner, respectively, of the board 20.

When the board 20 is fixed at the position of the first stopper 124, the board mark 20l and the individual mark 25a are used to calculate an amount of correction such as an amount of displacement for the first mounting area (a shaded portion in FIG. 17) of the board 20. When the board 20 is fixed at the position of the second stopper 127, the board mark 20m and the individual mark 25b are used to calculate an amount of correction such as an amount of displacement for the second mounting area (a shaded portion in FIG. 18) of the board 20. By using the individual marks as above in positioning each of the mounting areas, each of the mounting areas can be positioned without increasing the number of board marks on the board 20. To calculate an amount of correction for the first mounting area, the board mark 20l and the individual mark 25b may be used instead of the board mark 20l and the individual mark 25a. Likewise, to calculate an amount of correction for the second mounting area, the board mark 20m and the individual mark 25a may be used instead of the board mark 20m and the individual mark 25b. It is to be noted that out of a plurality of the individual marks, desirable substitute marks for board marks are those such that when the individual marks are substituted for the board marks, a distance between a pair of the board marks would be the longest. This allows improvement in the accuracy for correcting a component mounting position through recognition of the board marks and the individual marks. The individual marks may be replaced by lands, to which solder paste is applied in electronic components, or any other alternates, including wiring patterns and through holes, which can be photographed and located by a camera and thus substituted for the board marks. It is to be noted that criteria for selecting substitutes for the board marks among the above alternates are about the same as in the case of the individual marks. The substitutes for the board marks, such as the individual marks, lands, or wiring patterns, are mere examples of the board marks encompassed by appended claims.

Figure 19:
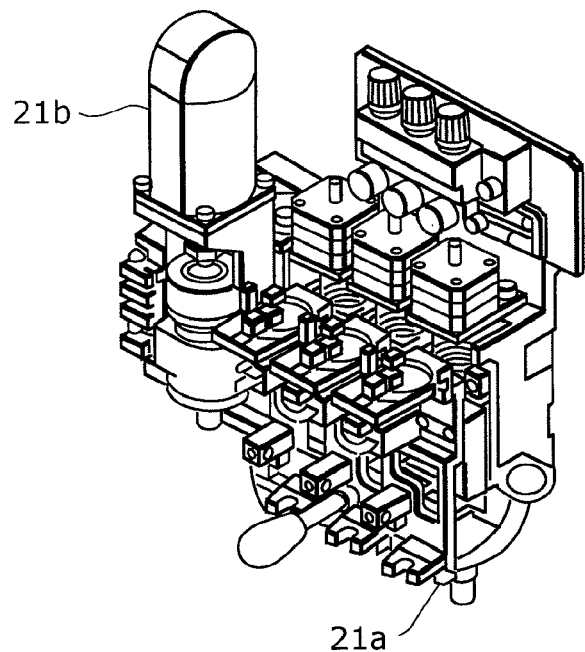
FIG. 19 is an outer view of a marking head for applying red ink onto a board placed in an adhesive dispenser.

FIG. 19 is an outer view of a marking head for applying red ink onto a board placed in an adhesive dispenser 21.

The marking head includes a tank 21b for holding red ink and an outlet portion 21a for delivering the ink onto the board 20.

Figure 20:
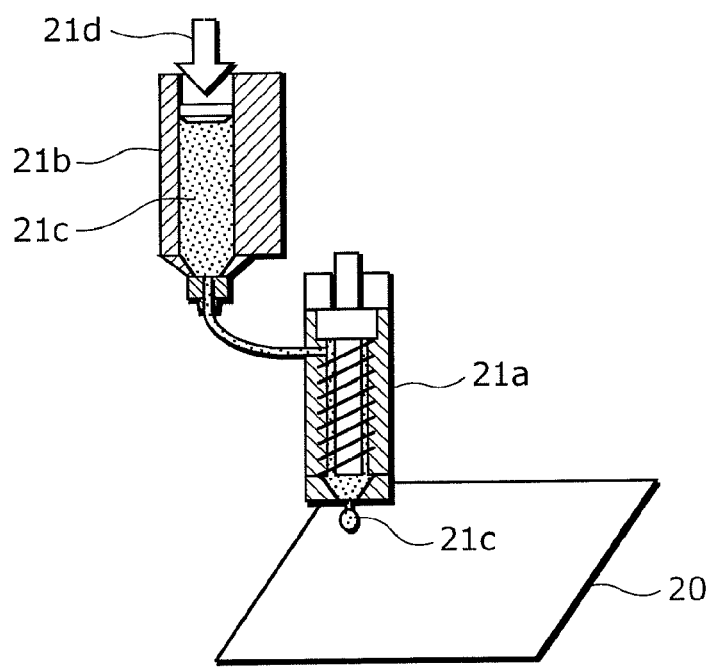
FIG. 20 is a view for illustrating red ink marking.

FIG. 20 is a view for illustrating red ink marking. The red ink 21c contained in the tank 21b is injected into the outlet portion 21a and pushed out from a top of the outlet portion 21a by air 21d. The ink pushed out is then applied onto the board 20.

Figure 21:
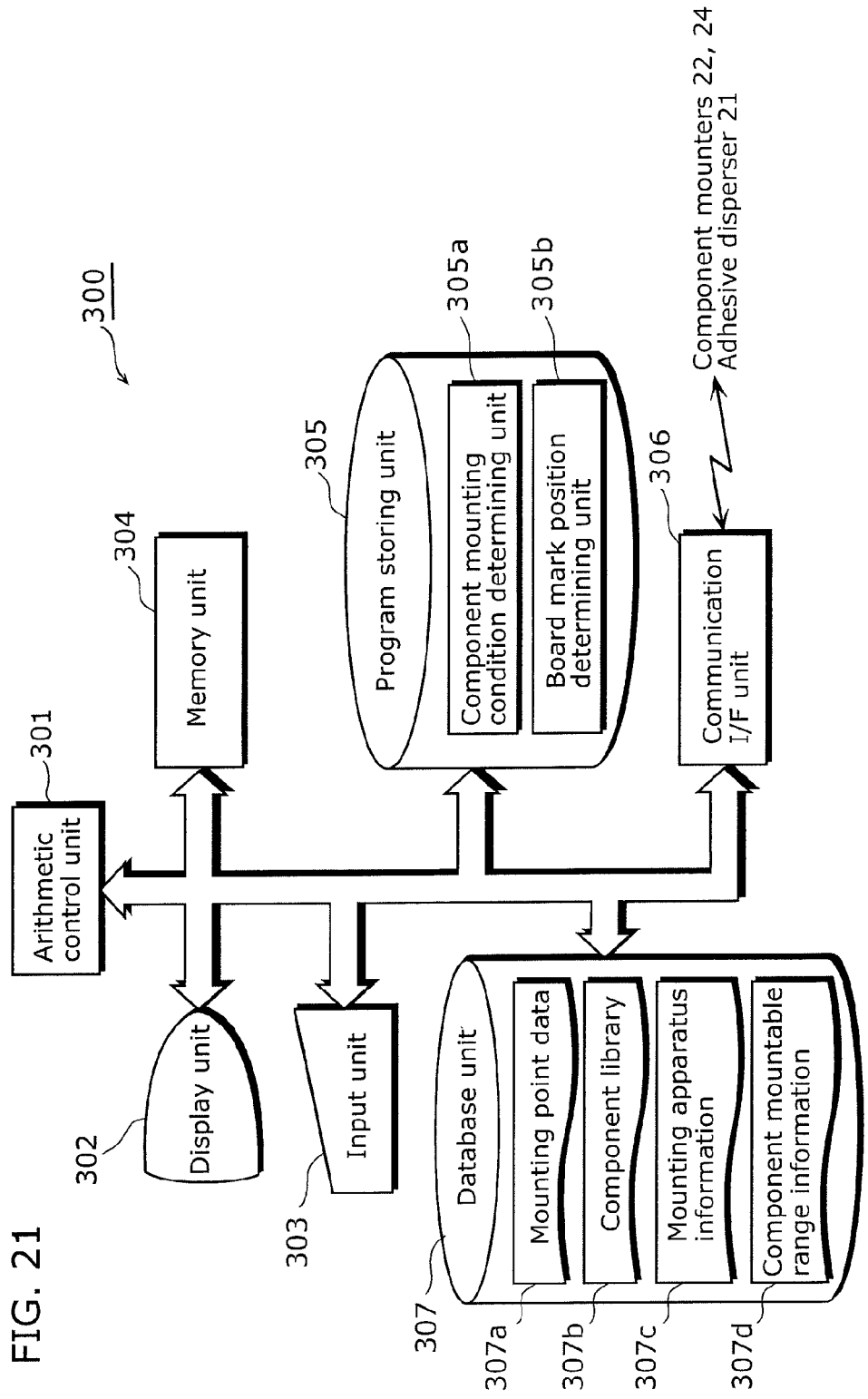
FIG. 21 is a block diagram showing a functional configuration of a control device.

FIG. 21 is a block diagram showing a functional configuration of a control device 300.

This control device 300 is a computer for configuring settings such as establishing a component mounting condition for the component mounters 22, 24 or determining positions of the board marks to be applied by the adhesive dispenser 21, and the computer includes an arithmetic control unit 301, a display unit 302, an input unit 303, a memory unit 304, a program storing unit 305, a communication interface (I/F) unit 306, and a database unit 307.

The control device 300 is implemented by a general-purpose computer system such as a personal computer by executing a program according to the present invention. When the adhesive dispenser 21, the component mounters 22, 24 and the like are not connected, the control device 300 also serves as a stand-alone simulator (a tool for determining a component mounting condition). It is to be noted that the function of the control device 300 may be installed in the adhesive dispenser 21, the component mounters 22, 24, and the like. The control device 300 corresponds to a mounting condition determining apparatus stated in the claims of the present invention.

The arithmetic control unit 301 is a Central Processing Unit (CPU), a numerical processor and the like. In response to an instruction or the like from the operator, the arithmetic control unit 301 loads a necessary program from the program storing unit 305 to the memory unit 304, and executes it. Then, in accordance with the execution result, the arithmetic control unit 301 controls each of the display unit 302, the input unit 303, the memory unit 304, and the program storing unit 305, and the communication I/F unit 306, and the database unit 307.

The display unit 302 is a Cathode-Ray Tube (CRT), a Liquid Crystal Display (LCD) or the like, while the input unit 303 is a keyboard, a mouse and the like. These units are used for interactive operations or the like between the control device 300 and the operator, under the control of the arithmetic control unit 301.

The communication I/F unit 306 is a Local Area Network (LAN) adapter or the like, and is used for communication and the like between the control device 300 and the adhesive dispenser 21 or the component mounters 22, 24, for example. The memory unit 304 is a Random Access Memory (RAM) or the like that provides a working area for the arithmetic control unit 301.

The database unit 307 is a hard disk or the like that stores, for example, input data (such as mounting point data 307a, a component library 307b, mounting apparatus information 307c, and component mountable range information 307d) used for processing of determining a component mounting condition and processing of determining marking positions of board marks, performed by the control device 300.

FIGS. 22 to 25 are diagrams respectively showing examples of the mounting point data 307a, the component library 307b, the mounting apparatus information 307c and the component mountable range information 307d.

The mounting point data 307a is a group of information that indicates mounting points for all components to be mounted. As shown in FIG. 22, one mounting point pi includes a component type ci, an x-coordinate xi, a y-coordinate yi, a mounting angle $\theta i$, and control data $\phi i$. Here, the "component type" corresponds to the component name in the component library 307b shown in FIG. 23. The "x-coordinate" and the "y-coordinate" are the coordinates of the mounting point (coordinates that indicate a particular position on the board). The "mounting angle" is a rotation angle of a component when being mounted onto the board. The "control data" is constraint information concerning the mounting of the component (such as the type of a usable pickup nozzle and the maximum moving speed of the line gang pickup head 121). It is to be noted that Numeric Control (NC) data to be eventually acquired is a sequence of mounting points that minimizes a line tact.

The component library 307b is a collection of information unique to each type of components that can be processed by the component mounters 22, 24 and the like. As shown in FIG. 23, the component library 307b contains for each component type: a component size; a tact (the takt unique to the component type under a particular condition); and other constraint information (such as the type of a usable pickup nozzle, the recognition method used by the component recognizing camera 126, and the maximum speed level of the line gang pickup head 121). Here, in the figure, appearances of components of various types are also shown as reference.

Figure 24:
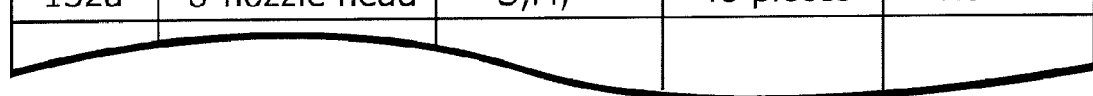
FIG. 24 is a view showing one example of mounting apparatus information.

The mounting apparatus information 307c is information that indicates the apparatus configuration, the above-mentioned constraint, and the like for all individual sub-equipment that make up is the production line. As shown in FIG. 24, the mounting apparatus information 307c includes: head information concerning, for example, the type of the line gang pickup heads 121 or the number of pickup nozzles provided in the line gang pickup heads 121; nozzle information concerning, for example, the type of the pickup nozzles that can be attached to the line gang pickup heads 121; cassette information concerning, for example, the maximum number of component cassettes 123; and tray information concerning, for example, the number of trays held in the tray supply unit 128.

Figure 25:
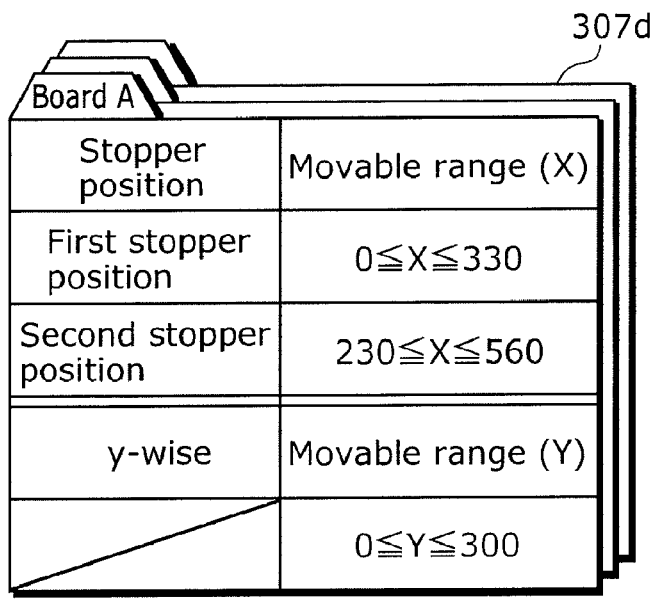
FIG. 25 is a view showing one example of component mountable range information.
Figure 26:
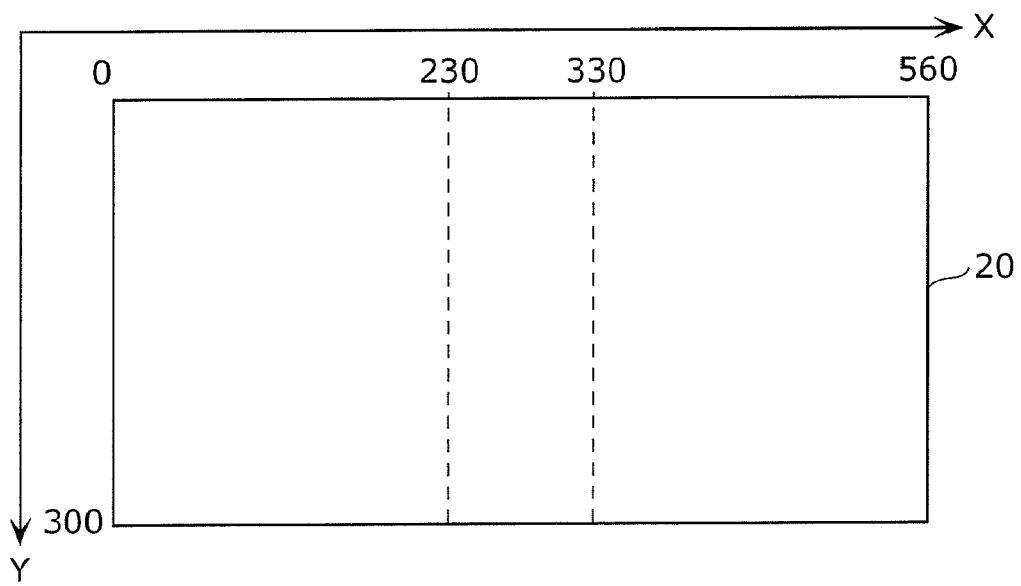
FIG. 26 is a view showing a component mountable range of a line gang pickup head.

The component mountable range information 307d is information that indicates a component mountable range of the line gang pickup head 121 specified along x-axis and y-axis, as shown in FIG. 25, in the case where the board 20 is fixed at the positions of the first stopper 124 and the second stopper 127. The x-coordinate and y-coordinate in the component mountable range originate at an upper-left corner of the board 20 as shown in FIG. 26. When a board A is fixed at the position of the first stopper 124, the component mountable range along the x-axis is 0 mm or more and 330 mm or less, and when the board A is fixed at the position of the second stopper 127, the component mountable range along the x-axis is 230 mm or more and 560 mm or less. And the component mountable range along the y-axis in these cases is 0 mm or more and 300 mm or less.

The program storing unit 305 shown in FIG. 21 is a hard disk and the like for storing various programs for implementing the function of the control device 300. The programs determine, for example, a component mounting condition for the component mounters 22, 24 and the positions of the board marks to be applied by the adhesive dispenser 21, and include a component mounting condition determining unit 305*a*, a board mark position determining unit 305*b*, and the like in terms of the function (as a processing unit that performs the function when executed by the arithmetic control unit 301).

The component mounting condition determining unit 305*a* determines a component mounting condition for the component mounters 22, 24.

The board mark position determining unit 305*b* determines, for example, the positions of the board marks to be applied by the adhesive dispenser 21 and the positions of the board marks to be recognized by the component mounters 22, 24.

Figure 27:
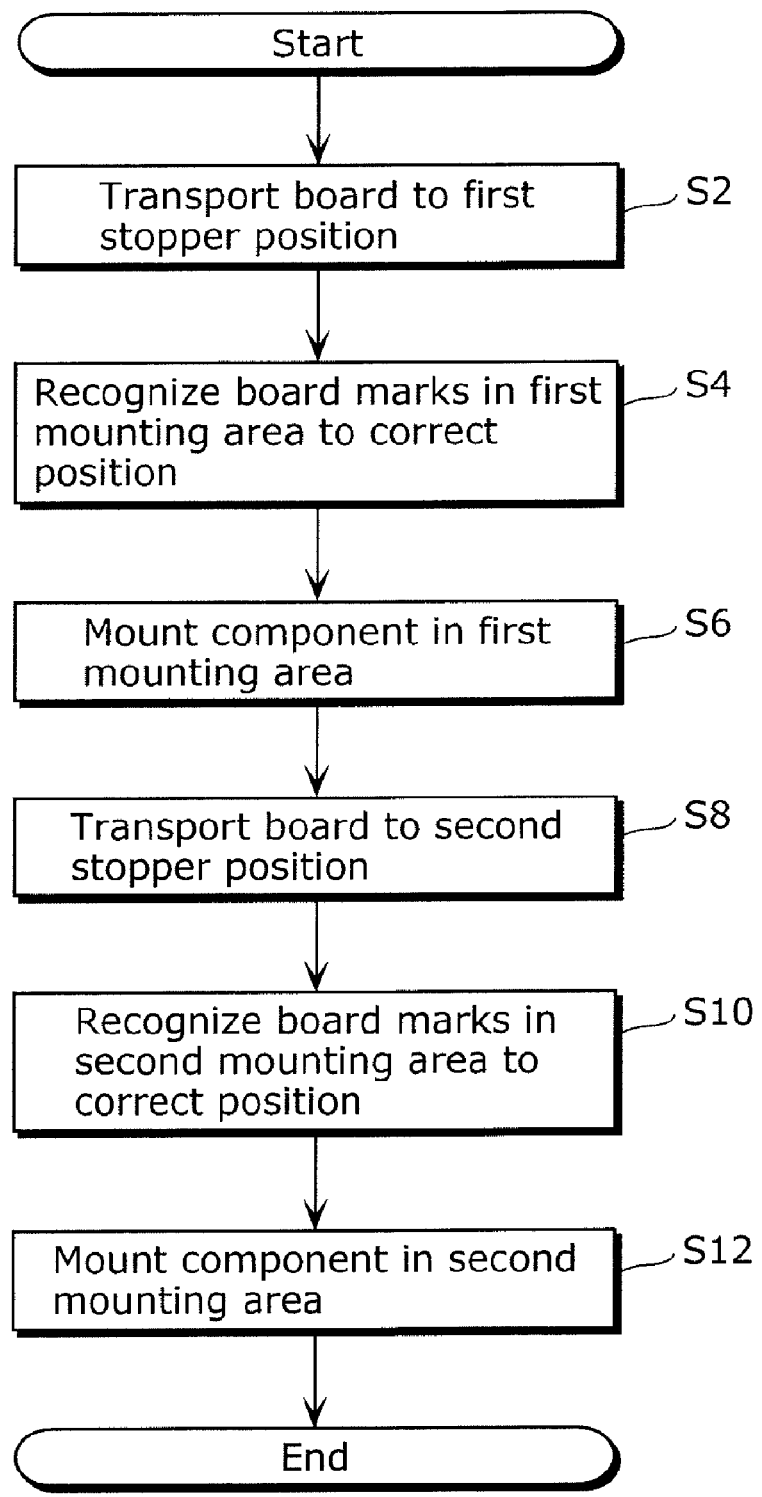
FIG. 27 is a flowchart of a component mounting process performed by a component mounter in accordance with a component mounting condition determined by a component mounting condition determining unit in the control device.

The component mounting condition determined by the component mounting condition determining unit 305*a* is mounting data (instruction data) which is used by the component mounters 22, 24 when they perform later-described operations as shown in FIG. 27. To be specific, the component mounting condition is presented in form of the mounting data (instruction data), according to which the component mounters 22 and 24 perform operations of transporting and positioning the board twice and, in each of the first and second mounting areas, recognizing board marks, correcting component mounting positions, and mounting components thereon so that the components can be mounted in the respective mounting areas.

To be more specific, the above mounting data is composed of board mark position data determined by the board mark position determining unit 305*b* and mounting order data determined by the component mounting condition determining unit 305*a*, in addition to the mounting point data 307*a*, the component library 307*b*, the mounting apparatus information 307*c*, and the component mountable range information 307*d*, which are stored in the database unit 307. The component mounters 22, 24 move the cameras to positions designated in the board mark position data in the above mounting data, thereby recognizing the board marks to correct the x-coordinate xi, the y-coordinate yi, and the mounting angle θi in the mounting point data 307*a*. Furthermore, the component mounters 22 and 24 mount the components in the order designated in the mounting order data, at coordinate positions designated in the mounting point data 307*a*.

The following shall describe a method for mounting components using the component mounters 22 and 24 in accordance with a component mounting condition determined by the component mounting condition determining unit 305*a*. To be more specific, the component mounting condition determining unit 305*a* determines a component mounting condition such that the component mounters 22, 24 operate in the following manner.

FIG. 27 is a flowchart of a component mounting process performed by the component mounter 22 in accordance with a component mounting condition determined by the component mounting condition determining unit 305*a* of the control device 300. The component mounter 24 operates in the same manner.

The component mounter 22 raises the first stopper 124 so that the board 20 is transported to the first stopper 124 (S2). The board 20 is then fixed at the position of the first stopper 124 as shown in FIG. 3, and the line gang pickup head 121 can move above the first mounting area.

The camera provided on the line gang pickup head 121 of either the front sub-equipment 120*a* or the rear sub-equipment 120*b* captures images of the pair of board marks 20*a*, 20*b* and recognizes the images. The image recognition enables to determine positions of the board marks 20*a*, 20*b*, and these positions are used to calculate an amount of correction such as an amount of displacement of the board 20 in a planar direction, an amount of displacement in a rotation of the board 20, and an amount of expansion and contraction of the board 20 (S4). The amount of correction thus calculated is utilized to correct the component mounting positions, at which components are mounted by the line gang pickup heads 121 of the front sub-equipment 120*a* and the rear sub-equipment 120*b*. It is to be noted that the positions of the board marks, which exist on a bottom left corner and a top right corner of the movable range, are set based on the component mountable range information 307*d*, and to these positions, the camera moves. The setting of the positions of the board marks and the moving of the camera may be performed in either of the following manners (a) and (b).

The positions of the board marks are set in advance based on the component mountable range information 307*d*, and these set positions (coordinates) of the board marks are written in the mounting data. The camera moves to the positions of the board marks, which are designated in the mounting data.

(b) Coordinates for the multiple board marks (such as the board marks, individual marks, and through holes) are written in the mounting data, and the component mountable range information 307*d* is used to determine which positions of the board marks the camera is to move to. Regarding which positions of the board marks the camera is to move to, such board marks that have the longest distance between the pair of board marks are chosen. The camera moves to the positions of the determined board marks.

The front sub-equipment 120*a* and the rear sub-equipment 120*b* operate in cooperation with each other to mount components in the first mounting area (S6). The cooperated operation is as described above with reference to FIGS. 5 and 6. How to determine an order of mounting components in the first mounting area shall be described hereinafter.

Next, the component mounter 22 lowers the first stopper 124 and raises the second stopper 127 so that the board 20 is transported to the position of the second stopper 127 (S8). The board 20 is then fixed at the position of the second stopper 127 as shown in FIG. 4, and the line gang pickup head 121 can move above the second mounting area.

The camera provided on the line gang pickup head 121 of either the front sub-equipment 120*a* or the rear sub-equipment 120*b* captures images of the pair of board marks 20*c*, 20*d* and recognizes the images. With this, an amount of correction is calculated such as an amount of displacement of the board 20 in a planar direction, an amount of displacement in a rotation of the board 20, and an amount of expansion and contraction of the board 20 (S10). The amount of correction thus calculated is utilized to correct the component mounting positions, at which components are mounted by the line gang pickup heads 121 of the front sub-equipment 120*a* and the rear sub-equipment 120*b*. It is to be noted that the positions of the board marks, which exist on a bottom left corner and a top right corner of the movable range, are set based on the component mountable range information 307*d*, and the camera moves to these positions.

The front sub-equipment 120*a* and the rear sub-equipment 120*b* operate in cooperation with each other to mount components in the second mounting area (S12). The cooperated operation is as described above with reference to FIGS. 5 and 6. How to determine an order of mounting components in the second mounting area shall be described hereinafter.

The following shall describe how to determine the order of mounting components in each of the first and second mounting areas.

Figure 28:
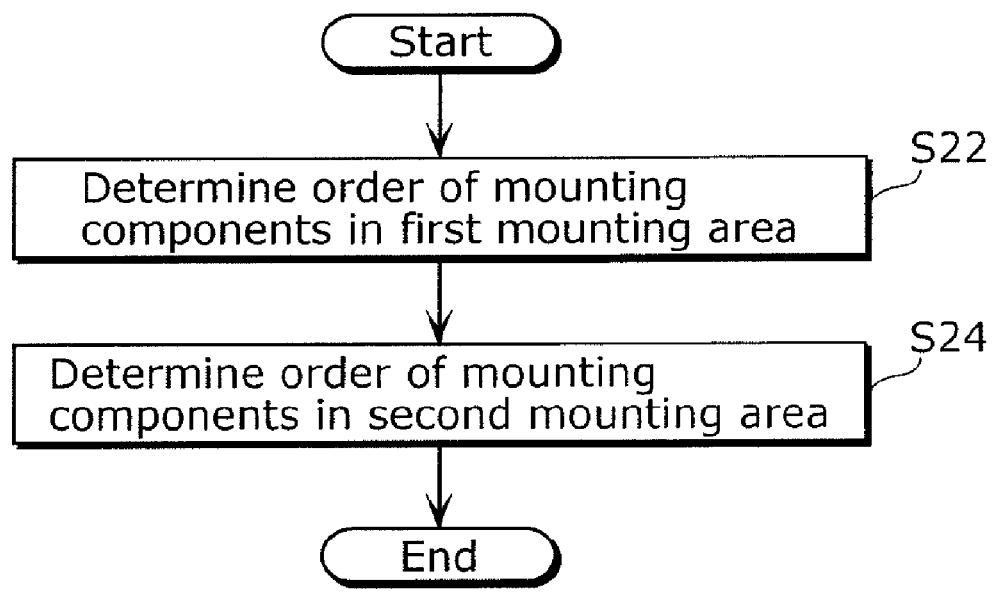
FIG. 28 is a flowchart of a process for determining an order of mounting components in each of the first and second mounting areas.

FIG. 28 is a flowchart of a process for determining the order of mounting components in each of the first and second mounting areas.

For example, in the case where the component mountable range of the board 20 fixed at each position of the first stopper 124 and the second stopper 127 is defined by the component mountable range information 307d shown FIG. 25, a part of the component mountable range which covers from 230 mm or more and 330 mm or less along the x-coordinate belongs to both the first and second mounting areas. In other words, the first mounting area and the second mounting area have an overlapping area. Accordingly, the components to be mounted in the overlapped area may be mounted either in mounting components in the first mounting area (S6 shown in FIG. 27) or in mounting components in the second mounting area (S12 shown in FIG. 27).

The component mounting condition determining unit 305a determines such an order of mounting components as to minimize a sum of the number of turns necessary for mounting components in the first mounting area and the number of turns necessary for mounting components in the second mounting area. Here, "turn" refers to one set of "pickup", "move" and "mounting" operations, which are repeated, of the line gang pickup head 121.

The component mounting condition determining unit 305a determines the order of mounting components such that when mounting the components in the first mounting area, the line gang pickup head 121 always has its all pickup nozzles with the components (S22).

Next, the component mounting condition determining unit 305a determines the order of mounting components such that all the rest of the components are mounted in the second mounting area (S24).

Figure 29:
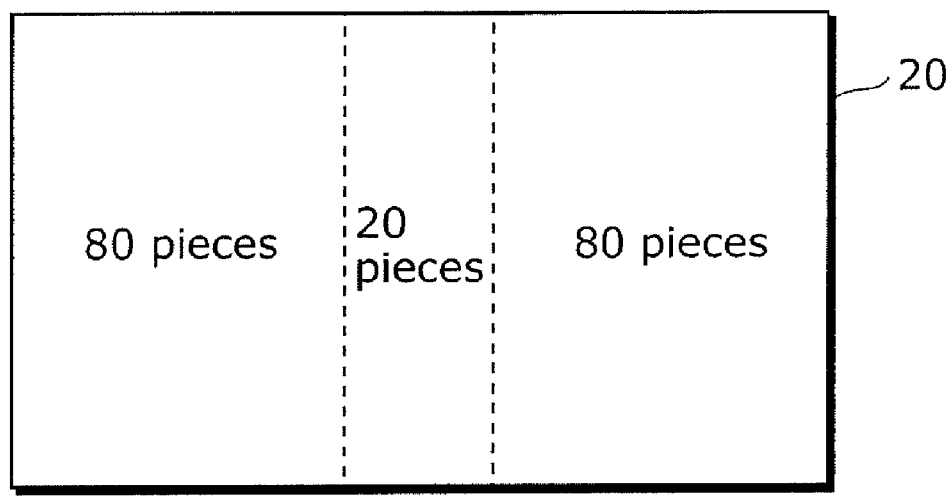
FIG. 29 is a view showing the number of components to be mounted in each of the mounting areas of the board.

For example, assume that as shown in FIG. 29, the number of components to be mounted in the first mounting area of the board 20 is 100, and the number of components to be mounted in the second mounting area of the board 20 is 100. The number of components to be mounted in a part of the first mounting area, which does not overlaps with any part of the second mounting area, is 80, and the number of components to be mounted in a part of the second mounting area, which does not overlap with any part of the first mounting area, is 80. Further, the number of components to be mounted in an overlapping area between the first mounting area and the second mounting area is 20. Furthermore, the number of pickup nozzles of each of the line gang pickup heads 121 in the front sub-equipment 120a and in the rear sub-equipment 120b is 8.

In this case, the number of components to be picked up by the line gang pickup head 121 has to be a multiple of 8 in order that the components are mounted in the first mounting area by the line gang pickup head 121 whose pickup nozzles all hold the components. Accordingly, the component mounting condition determining unit 305a determines 12 as the number of turns in the first mounting area, by dividing 100 by 8. As a result, 96 (=8×12) components are mounted in the first mounting area. The components which are not mounted in the first mounting area, that is, 4 (=100−96) components, are supposed to be mounted in the second mounting area. These remaining 4 components therefore have to be present in the overlapping area between the first mounting area and the second mounting area.

The component mounting condition determining unit 305a determines an order of mounting the 96 components. As to how to determine the order of mounting components, various methods have been proposed conventionally. The component mounting condition determining unit 305a therefore determines the order of mounting components in accordance with one of the various methods, which have been proposed conventionally.

The component mounting condition determining unit 305a determines also an order of mounting the components in the second mounting area so that the remaining 4 components are mounted in the area overlapping with the first mounting area and that 80 components are mounted in the area not overlapping with the first mounting area.

In order to mount 84 (=80+4) components, 11 turns at minimum allows mounting of the components since the number of the pickup nozzles is 8. The component mounting condition determining unit 305a determines an order of mounting the 84 components. As to how to determine the order of mounting components, various methods have been proposed conventionally. The component mounting condition determining unit 305a therefore determines the order of mounting components in accordance with one of the various methods, which have been proposed conventionally.

Consequently, the number of turns in the first mounting area is 12, and the number of turns in the second mounting area is 11. The sum of both turns can be minimized by setting that as described above the line gang pickup head 121 has its all pickup nozzles with components when mounting the components in the first mounting area. It is to be noted that the number of turns in the first mounting area may be 11 and the number of turns in the second mounting area may be 12 as long as the sum of both turns is minimum.

The overlapping area between the first mounting area and the second mounting area is determined based on the component mountable range information 307d. In addition, an area to which each component to be mounted onto the board 20 belongs is determined based on the component mountable range information 307d and the mounting point data 307a.

The following shall describe how to determine positions of board mark to be applied by the adhesive dispenser 21.

Figure 30:
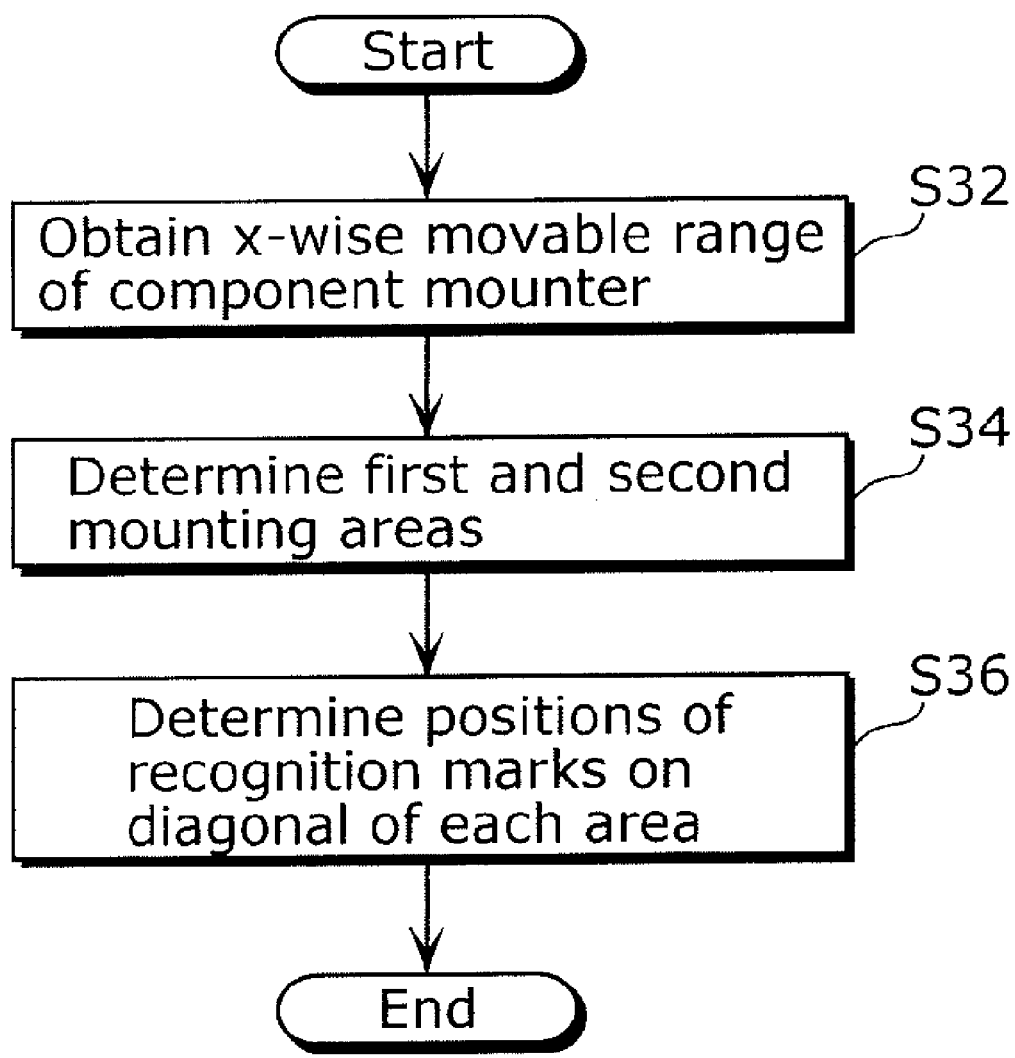
FIG. 30 is a flowchart of a process of determining positions of board marks to be applied by the adhesive dispenser.

FIG. 30 is a flowchart of a process of determining the positions of the board marks to be applied by the adhesive dispenser 21.

The board mark position determining unit 305b acquires the component mountable range information 307d stored in the database unit 307 (S32).

The board mark position determining unit 305b determines the first mounting area and the second mounting area based on the component mountable range information 307d (S34). For example, according to the component mountable range information 307d shown in FIG. 25, the first mounting area is determined to extend from 0 mm or more and 330 mm or less along the x-axis in the coordinates on the board 20, and the second mounting area is determined to extend from 230 mm or more and 560 mm or less along the x-axis in the coordinates on the board 20, as shown in FIG. 26. Of these areas, an area extending from 230 mm or more and 330 mm or less along the x-axis in the coordinates on the board 20 belongs to both the first and second mounting areas.

Figure 8:
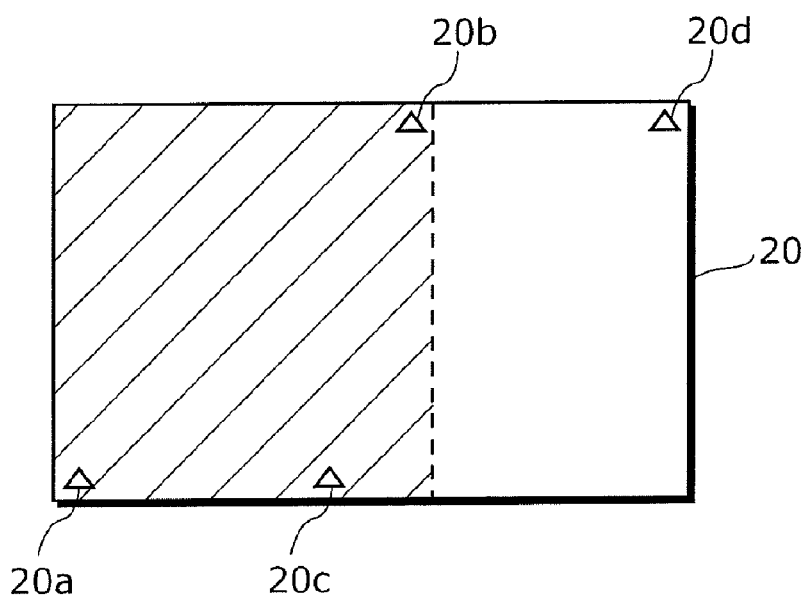
FIG. 8 is a view showing the first mounting area of the board shown in FIG. 7.
Figure 9:
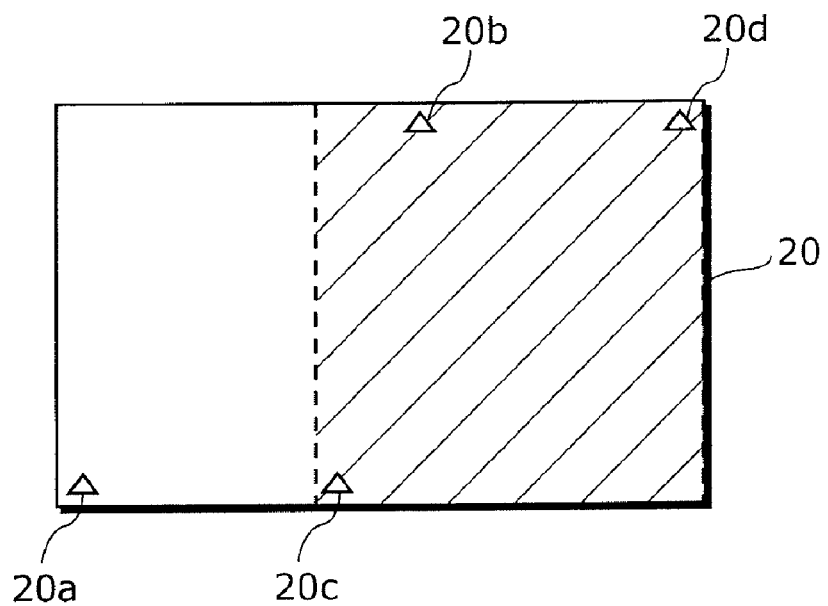
FIG. 9 is a view showing the second mounting area of the board shown in FIG. 7.

The board mark position determining unit 305b determines diagonal corners of each of the first mounting area and the second mounting area as positions of the board marks to be applied (S36). For example, it is determined that, as shown in FIG. 8, the respective positions of the board marks to be applied are located inward by a predetermined distance from a bottom left corner position (i.e. a position having a minimum x-coordinate and a minimum y-coordinate) and a top right corner position (i.e. a position having a maximum x-coordinate and a maximum y-coordinate), of the first mounting area. Likewise, it is determined that, as shown in FIG. 9, the respective positions of the board marks to be applied are located inward by a predetermined distance from a bottom left corner position (i.e. a position having a minimum x-coordinate and a minimum y-coordinate) and a top right corner position (i.e. a position having a maximum x-coordinate and a maximum y-coordinate), of the second mounting area. It is to be noted that the positions of the board marks to be applied are determined so as not to overlap with positions at which components are to be mounted. The ranges of the first mounting area and the second mounting area are obtained from the component mountable range information 307d.

The adhesive dispenser 21 lays red ink, which will serve as the board marks, at the determined positions on the board 20 before or after adhesive coating. Information about the positions of the board marks thus applied is transmitted to the component mounters 22, 24. The component mounters 22, 24 receive this information and refer to the received information to perform a process of recognizing the applied board marks. It is to be noted that the board marks may be of ink of any color other than red.

As explained above, each of the first mounting area and the second mounting area is provided with the board marks for positioning the board according to the present embodiment. Such provision of the board marks in each of the mounting areas allows for obtaining an amount of correction such as an amount of displacement of the board in both cases where the board is fixed at the position of the first stopper and where the board is fixed at the position of the second stopper. Consequently, the components can be mounted with high mounting accuracy even onto the board which is long in the transportation direction in the component mounter.

The component mounting condition is determined so that the components are mounted in the first mounting area always by the line gang pickup head 121 having all its pickup nozzles with the components. This allows for determining the order of mounting components such as to minimize the sum of the number of turns necessary for mounting the components in the first mounting area and the number of turns necessary for mounting the components in the second mounting area.

The adhesive dispenser is configured to lay the ink to provide the board marks. It is therefore possible to provide the board marks in each of mounting areas on a board even in the case where the board has no board marks when transported from an upstream step.

It is therefore possible to obtain the amount of correction for each of the component mounting positions by recognizing the positions of the board marks when the components are being mounted in each of the mounting areas. Consequently, by setting the first mounting area and the second mounting area along the transportation direction, the components can be mounted with high accuracy even onto a board which is long in the transportation direction in the component mounter.

Since the board marks are placed on the diagonal, it is possible to precisely obtain an amount of correction such as an amount of displacement of the board in the planar direction, an amount of displacement in the rotation of the board, and an amount of expansion and contraction of the board; that is, it is possible to obtain a precise amount of correction for the component mounting positions. As a result, the components can be mounted with high mounting accuracy.

The production systems according to the embodiments of the present invention are so far described, and note that the present invention is not limited to the above-described embodiments.

For example, the control device may exist in a different company from where the adhesive dispenser and the component mounters are present. That is to say, there may be a company which determines the component mounting condition and the positions of the board marks to be applied and provides the service of providing the determined condition and positions. In this case, the component mountable range information of the line gang pickup head registered in the database unit of the control device may be obtained from a mounting production manufacturer, which produces circuit boards by mounting components onto boards. Alternatively, the component mountable range information of the line gang pickup head registered in the database unit of the control device may be obtained from a manufacturer, which produces the component mounter itself. In this case, a manufacturer of boards may have the adhesive dispenser and use it to provide board marks on boards being manufactured. In the manufacturer of boards, a pair of board marks may be printed in each mounting area on a board on which a wiring pattern such as a land is being printed. In this case, the board marks are printed in the same process as that of board mark application by use of the adhesive dispenser shown in FIG. 30. In other words, a device for printing wiring patterns prints the board marks, instead of applying the board marks. In this case, the manufacturer of boards obtains the component mountable range information of the line gang pickup head from the manufacturer, which produces the component mounter itself, or a mounting production manufacturer.

In the case where the board marks are printed in the manufacturer of boards, the control device 300 and the printing device correspond to the board manufacturing apparatus in the embodiments of the present invention. In the case where the board marks are printed by the adhesive dispenser 21, the control device 300 and the adhesive dispenser 21 correspond to the board manufacturing apparatus indicated by appended claims of the present invention.

The component mounter is not limited to the configuration that two line gang pickup heads operate in cooperation to mount components on a single board. For example, the component mounter may be configured to mount components on a single board with use of a single line gang pickup head.

In the above embodiments, the single component mounter mounts the components in the two mounting areas, i.e., the first and second mounting areas. Instead, two component mounters may operate in cooperation to mount the components in the two mounting areas. To be specific, in the production system 10 shown in FIG. 1, the component mounter 22 may perform the component mounting in the first mounting area, and the component mounter 24 may perform the component mounting in the second mounting area. Since the two component mounters operate in cooperation to mount the components, the second stopper needs to be provided only in one of the component mounters. The decrease in the number of the component mounters having the second stopper enables the production line to be shorter because the second stopper is positioned laterally outside of the component mounter.

In the above embodiments, the component mounting condition is determined such that when mounting the components in the first mounting area, all the pickup nozzles hold the components. Instead, the component mounting condition may be determined such that when mounting the components in the second mounting area, all the pickup nozzles hold the components.

In the above embodiments, the board is stopped at the position of the first or second stopper disposed in the component mounter, but the stop position of the board is not limited to such a position. The following shall describe the other stop positions of the board with reference to FIG. 31 to 34. It is to be noted that the board 20 having the three board marks 20e to 20g as shown in FIG. 10 is taken here as an example for explanation, while the positions and the number of board marks are not limited to such a board and for example, a board may be used which has board marks on both ends of each of the first and second mounting areas as shown in FIG. 7.

Figure 31:
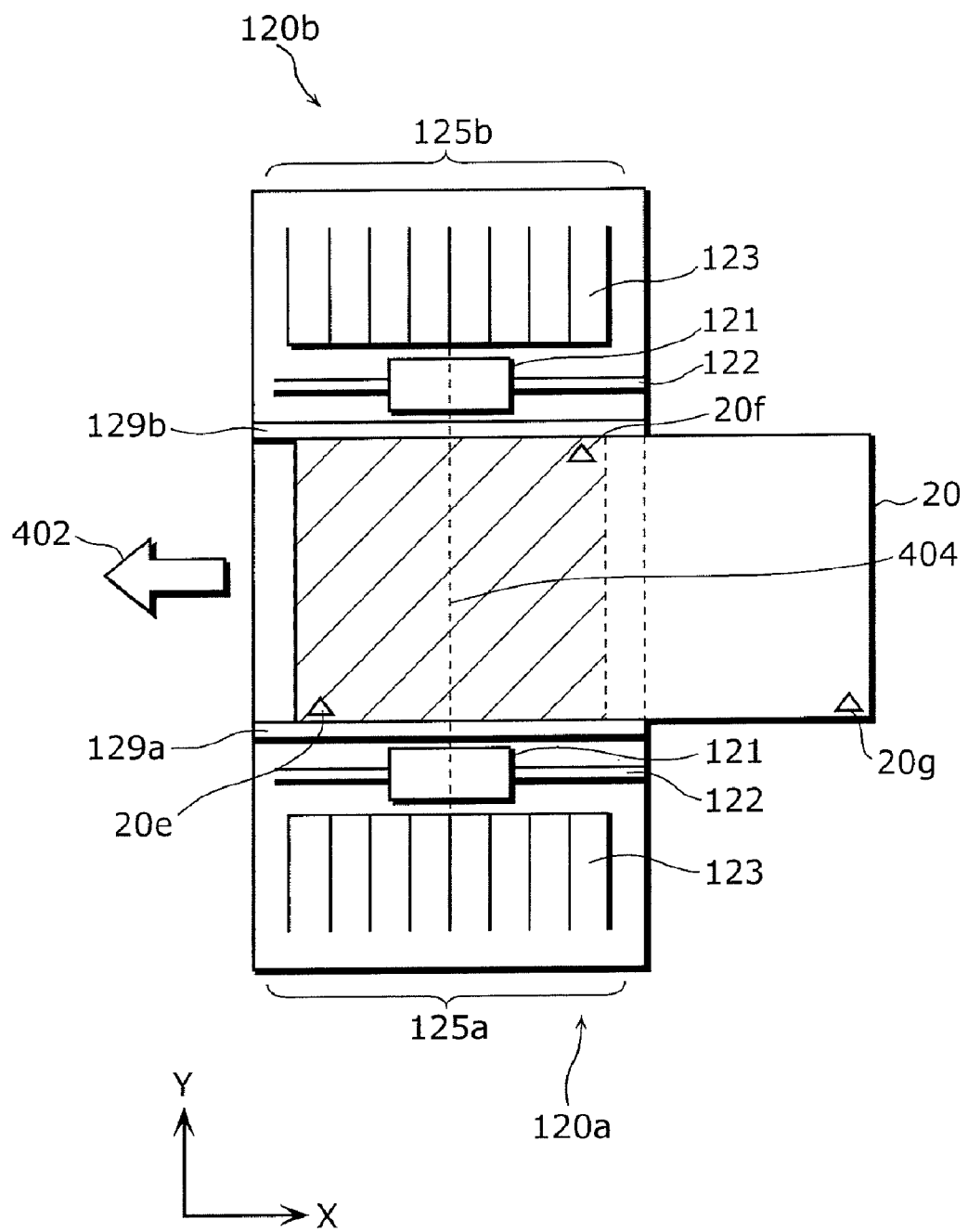
FIG. 31 is a view for illustrating the first variation of board stop positions.
Figure 32:
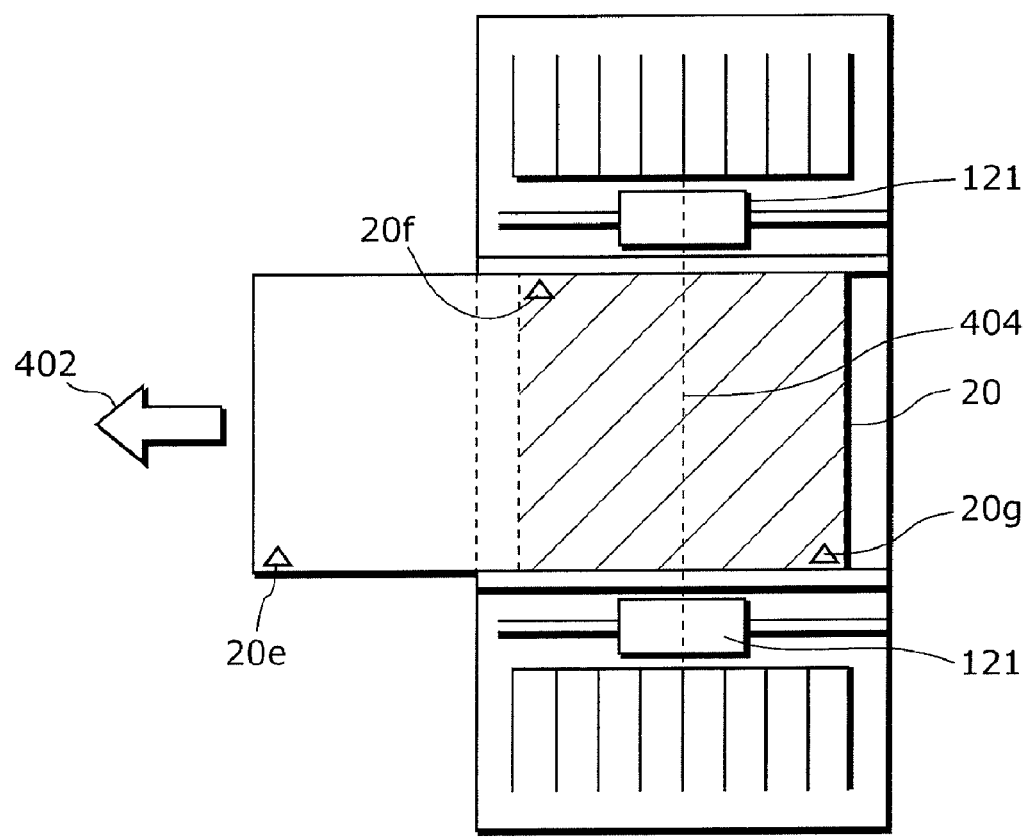
FIG. 32 is a view for illustrating the first variation of board stop positions.

With reference to FIGS. 31 and 32, the first variation of the stop position of the board is explained. Firstly, as shown in FIG. 31, the board 20 is transported in a direction indicated by an arrow 402 and made to stop at a position where a center position along the x-axis of the first mounting area (a shaded portion) of the board 20 coincides with a center line 404 extending in the x-axis direction of the component mounter 22. At this stop position, components are mounted in the first mounting area. After completion of component mounting to the first mounting area, as shown in FIG. 32, the board 20 is transported in the direction indicated by the arrow 402 and made to stop at a position where a center position along the x-axis of the second mounting area (a shaded portion) of the board 20 coincides with the center line 404 extending in the x-axis direction of the component mounter 22. At this stop position, components are mounted in the second mounting area. Mounting the components onto the board 20 stopped at these positions allows for a reduction in a sum of distances from the center line 404 to the component mounting positions. Usually, a home position of the line gang pickup head 121 is set at a position on the center line 404. It is therefore possible to shorten a travel distance of the line gang pickup head 121 and thus shorten a length of time for mounting.

Figure 33:
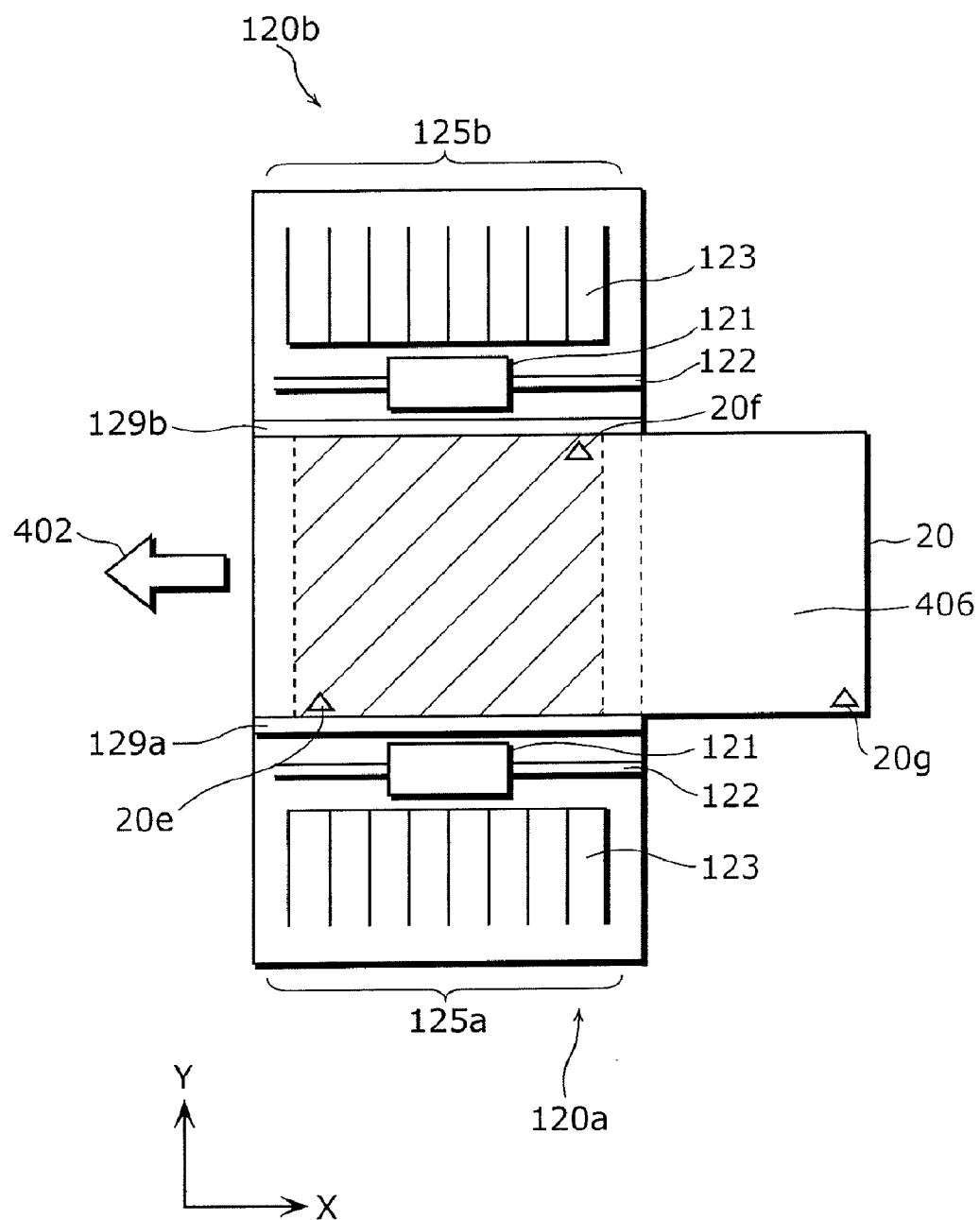
FIG. 33 is a view for illustrating the second variation of board stop positions.
Figure 34:
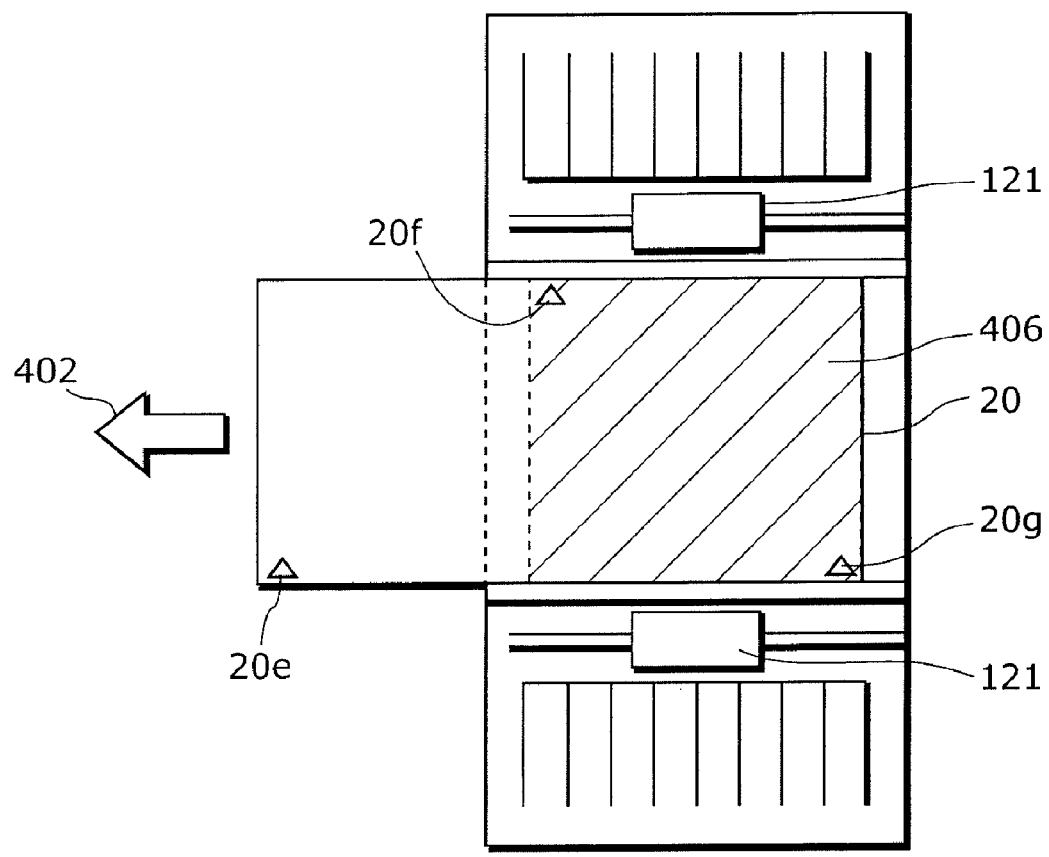
FIG. 34 is a view for illustrating the second variation of board stop positions.

With reference to FIGS. 33 and 34, the second variation of the stop position of the board is explained. Firstly, as shown in FIG. 33, the board 20 is transported in a direction indicated by an arrow 402 and made to stop at a position where a left end of the first mounting area (a shaded portion) of the board 20 coincides with a left end of the component mountable range of the component mounter 22. At this stop position, components are mounted in the first mounting area. After completion of component mounting to the first mounting area, as shown in FIG. 34, the board 20 is transported in the direction indicated by the arrow 402 and made to stop at a position where an area (a blank area 406 in FIG. 33) other than the first mounting area become all included in the component mountable range of the component mounter 22. In other words, the board 20 is made to stop at a position where a right end of the second mounting area (a shaded portion) of the board 20 coincides with a right end of the component mountable range of the component mounter 22. At this stop position, components are mounted in the second mounting area. Mounting the components onto the board 20 stopped at these positions allows minimizing a distance for the board 20 to be transported from the stop position of the board for mounting the components in the first mounting area to the stop position of the board for mounting the components in the second mounting area. That is, it is possible to minimize a length of time for the board 20 to be transported after completion of component mounting to the first mounting area until the component mounting to the second mounting area starts. In the meantime, the board 20 on which the component mounting to the second mounting area has completed is transported away when another board 20 on which components are to be mounted next is transported into the component mounter 22, resulting in no need to take into account the length of time for carrying away the board 20 on which the component mounting to the second mounting area has completed. Accordingly, in a situation where the boards 20 flow into the component mounter 22 one after another, it is possible to minimize the time required for transportation of the boards 20 by, as described above, minimizing the length of time for each of the boards 20 to be transported after completion of the component mounting to the first mounting area until the component mounting to the second mounting area starts.

It is to be noted that it is effective to utilize the first variation in a case where the time for the component mounting is relatively longer than the time for the transportation of the boards 20, i.e., in a case where a relatively large number of components are to be mounted. The second variation is effective in a case where the time for the component mounting is relatively shorter than the time for the transportation of the boards 20, i.e., in a case where a relatively small number of components are to be mounted.

Figure 35:
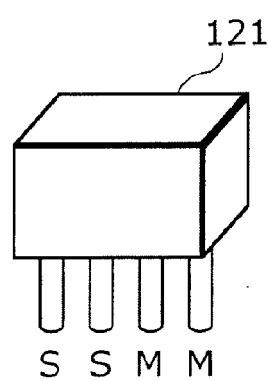
FIG. 35 is a view showing one type example of a pickup nozzle provided in the line gang pickup head.
Figure 36:
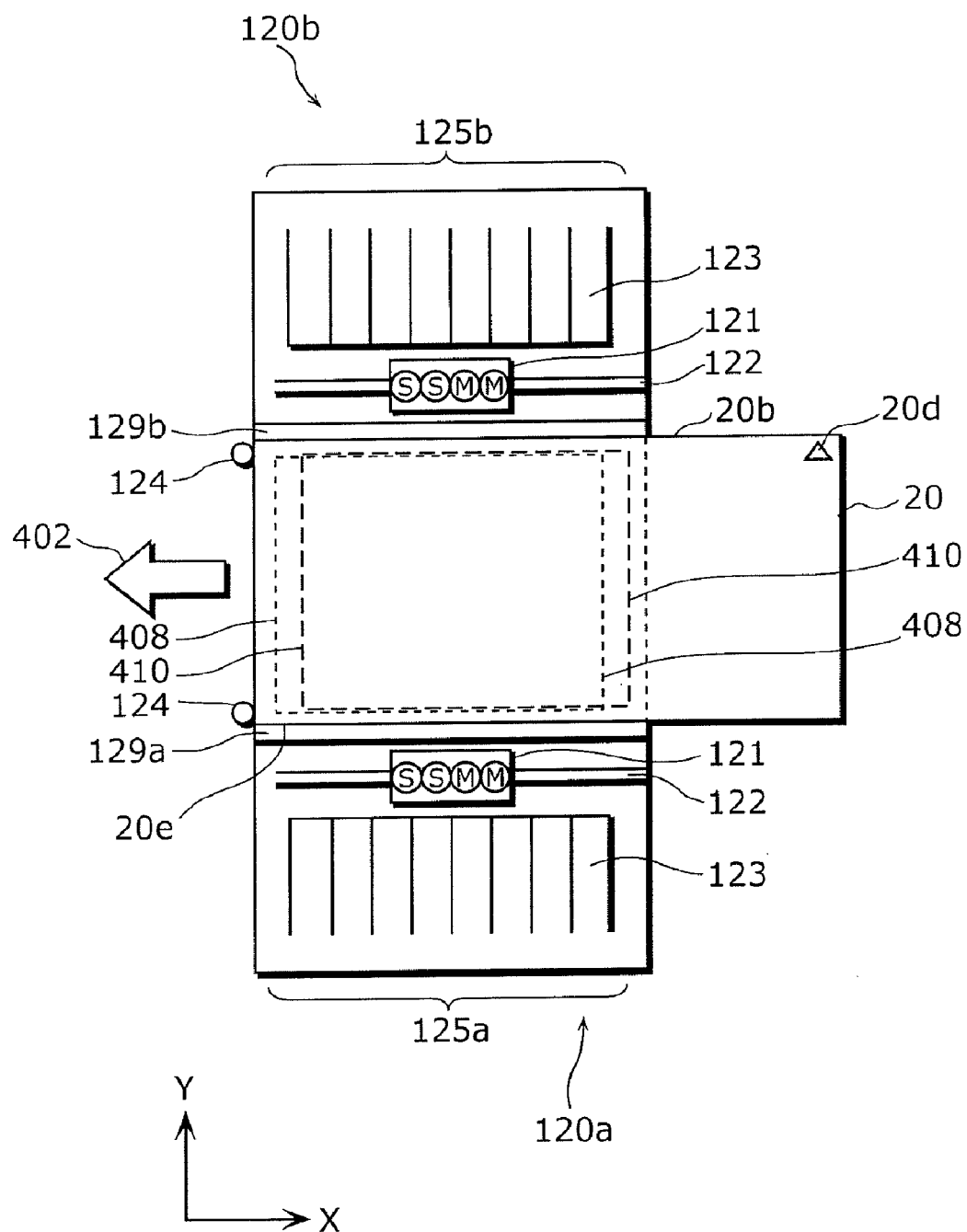
FIG. 36 is a view showing component mountable ranges of S type and M type pickup nozzles.

The component mountable range is determined based on a movable range of the line gang pickup head 121 in the above embodiments, but it may be determined based on a movable range for each type of the pickup nozzles provided in the line gang pickup head 121. In a case where types and positions of the pickup nozzles in the line gang pickup head 121 are fixed in advance, there is an area where components of some types cannot be mounted even if the area is included in the movable range of the line gang pickup head 121. For example, as shown in FIG. 35, the types of the pickup nozzles provided in the line gang pickup head 121 are "S", "S", "M", and "M" and that these pickup nozzles are undetachably fixed to the line gang pickup head 121. In FIG. 36, a component mountable range 408 of the pickup nozzle of S type in the line gang pickup head 121 and a component mountable range 410 of the pickup nozzle of M type in the line gang pickup head 121 are indicated by rectangular dashed lines. Shifting the component mountable range 408 by a predetermined distance leads to the component mountable range 410. The predetermined distance is equal to a distance between the pickup nozzle of S type on a left end and the third pickup nozzle of M type from the left in the line gang pickup head 121. In the line gang pickup head 121, the pickup nozzles of S type are located on the left side while the pickup nozzles of M type are located on the right side. Accordingly, in a situation where the line gang pickup head 121 is moved to the left end of the component mounter 22, the pickup nozzles of S type can mount components onto further left part of the board than the pickup nozzles of M type can, and there is an area where the pickup nozzles of M type cannot mount components. Likewise, in a situation where the line gang pickup head 121 is moved to the right end of the component mounter 22, the pickup nozzles of M type can mount components onto further right part of the board than the pickup nozzles of S type can, and there is an area where the pickup nozzles of S type cannot mount components. This is why the component mountable range is determined for each type of the pickup nozzles as stated above. Thus, for example, when only the pickup nozzles of S type are used to mount components onto the board 20, the component mountable range of the line gang pickup head 121 is set to the component mountable range 408 of the S-type pickup nozzles, while, when only the pickup nozzles of M type are used to mount components onto the board 20, the component mountable range of the line gang pickup head 121 is set to the component mountable range 410 of the M-type pickup nozzles.

The above disclosed embodiments are to illustrate the present invention and are not to be considered as limitations of the present invention. The scope of the present invention is represented by Claims and not by the above provided description, and is intended to include equivalent meaning of the Claims and all modifications within the scope.

Industrial Applicability

The present invention can be applied to a component mounter which mounts a component onto a board and in particular, to a component mounter which mounts a component onto a board that is long in its transportation direction by stopping the board at two stopper positions.

The invention claimed is:

1. A component mounting method for use in a component mounter which mounts a plurality of components onto a board, wherein the board has a first mounting area and a second mounting area which are different from each other, the first mounting area and the second mounting are corresponding to a component mountable range that is a range in which a mounting head of the component mounter can mount the components without moving the board, wherein the first mounting area and the second mounting area are disposed along a transportation direction of the board and have an overlapping area, wherein the first mounting area has a pair of separate board marks each positioned near either end of the first mounting area, and wherein the second mounting area has a pair of separate board marks each positioned near either end of the second mounting area, said component mounting method comprising:

calculating a first amount of correction by (i) recognizing positions of the board marks in the first mounting area, (ii) calculating an amount of displacement of the recognized positions from predetermined positions of the board marks in the first mounting area, and (iii) calculating, based on the amount of displacement, an amount of correction for mounting position of a plurality of first components;

mounting the first component at the mounting position of the first components in the first mounting area, the mounting position of the first components being corrected based on the amount of correction calculated in said calculating a first amount of correction;

calculating a second amount of correction after said mounting the first components at the mounting positions of the first components in the first mounting area, by (i) recognizing positions of the board marks in the second mounting area, (ii) calculating an amount of displacement of the recognized positions from predetermined positions of the board marks in the second mounting area, and (iii) calculating, based on the amount of displacement, an amount of correction for mounting positions of a plurality of second components; and mounting the second components at the mounting positions in the second components in the second mounting area, the mounting positions of the second components being corrected based on the amount of correction calculated in said calculating a second amount of correction.

2. The method for component mounting according to claim 1, further comprising moving the board to a position where the component mounter can mount the second components at the mounting positions of the second components in the second mounting area, after said mounting the first components at the mounting positions of the first components in the first mounting area.

3. The method for component mounting according to claim 1, wherein said calculating a first amount of correction includes:

obtaining a component mountable range of the mounting head for the first components;

determining positions of the board marks in the first mounting area based on the obtained component mountable range of the mounting head for the first components;

recognizing the positions of the board marks by moving a camera to the determined positions of the board marks; and calculating an amount of correction for the mounting positions of the first components based on a result of said recognizing.

* * * * *